United States Patent
Whetsel

(10) Patent No.: US 10,068,816 B2
(45) Date of Patent: Sep. 4, 2018

(54) SCAN CELL COUPLED TO VIA ENDS, BUFFER COUPLED TO VIA

(71) Applicant: TEXAS INSTRUMENTS INCORPORATED, Dallas, TX (US)

(72) Inventor: Lee D. Whetsel, Parker, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 15/788,282

(22) Filed: Oct. 19, 2017

(65) Prior Publication Data

US 2018/0061723 A1  Mar. 1, 2018

Related U.S. Application Data

(62) Division of application No. 15/386,970, filed on Dec. 21, 2016, now Pat. No. 9,824,947, which is a division of application No. 15/182,817, filed on Jun. 15, 2016, now Pat. No. 9,559,025, which is a division of application No. 13/712,459, filed on Dec. 12, 2012, now abandoned.

(60) Provisional application No. 61/577,401, filed on Dec. 19, 2011.

(51) Int. Cl.
| | |
|---|---|
| *G01R 31/02* | (2006.01) |
| *H01L 21/66* | (2006.01) |
| *H01L 23/48* | (2006.01) |
| *G01R 31/28* | (2006.01) |
| *G01R 31/3185* | (2006.01) |
| *H01L 25/065* | (2006.01) |

(52) U.S. Cl.
CPC .......... *H01L 22/34* (2013.01); *G01R 31/2853* (2013.01); *G01R 31/318513* (2013.01); *G01R 31/318538* (2013.01); *H01L 23/481* (2013.01); *H01L 25/0657* (2013.01); *H01L 2225/06513* (2013.01); *H01L 2225/06544* (2013.01); *H01L 2225/06596* (2013.01)

(58) Field of Classification Search
CPC ........ G01R 31/318513; G01R 31/2853; G01R 31/318572; G01R 31/31717; G01R 31/31855; G01R 31/318597; G01R 31/318541; G01R 31/3187; G01R 31/318511; G01R 31/2851; G01R 31/2856; G01R 31/04; G01R 31/281
See application file for complete search history.

(56) References Cited

U.S. PATENT DOCUMENTS

| | | | |
|---|---|---|---|
| 2010/0060310 A1* | 3/2010 | Laisne | H01L 25/0657 326/10 |
| 2011/0093224 A1 | 4/2011 | Ide et al. | |
| 2012/0138927 A1* | 6/2012 | Kang | G01R 31/31851 257/48 |
| 2012/0242367 A1 | 9/2012 | Goel | |
| 2013/0121092 A1* | 5/2013 | Ogasawara | G11C 7/00 365/189.15 |

* cited by examiner

*Primary Examiner* — Tung X Nguyen
(74) *Attorney, Agent, or Firm* — Lawrence J. Bassuk; Charles A. Brill; Frank D. Cimino

(57) ABSTRACT

The disclosure describes a novel method and apparatus for testing different types of TSVs in a single die or different types of TSV connections in a stack of die. The testing is facilitated by test circuitry associated with each type of TSV. The test circuitry includes a scan cell adapted for testing TSVs.

6 Claims, 20 Drawing Sheets

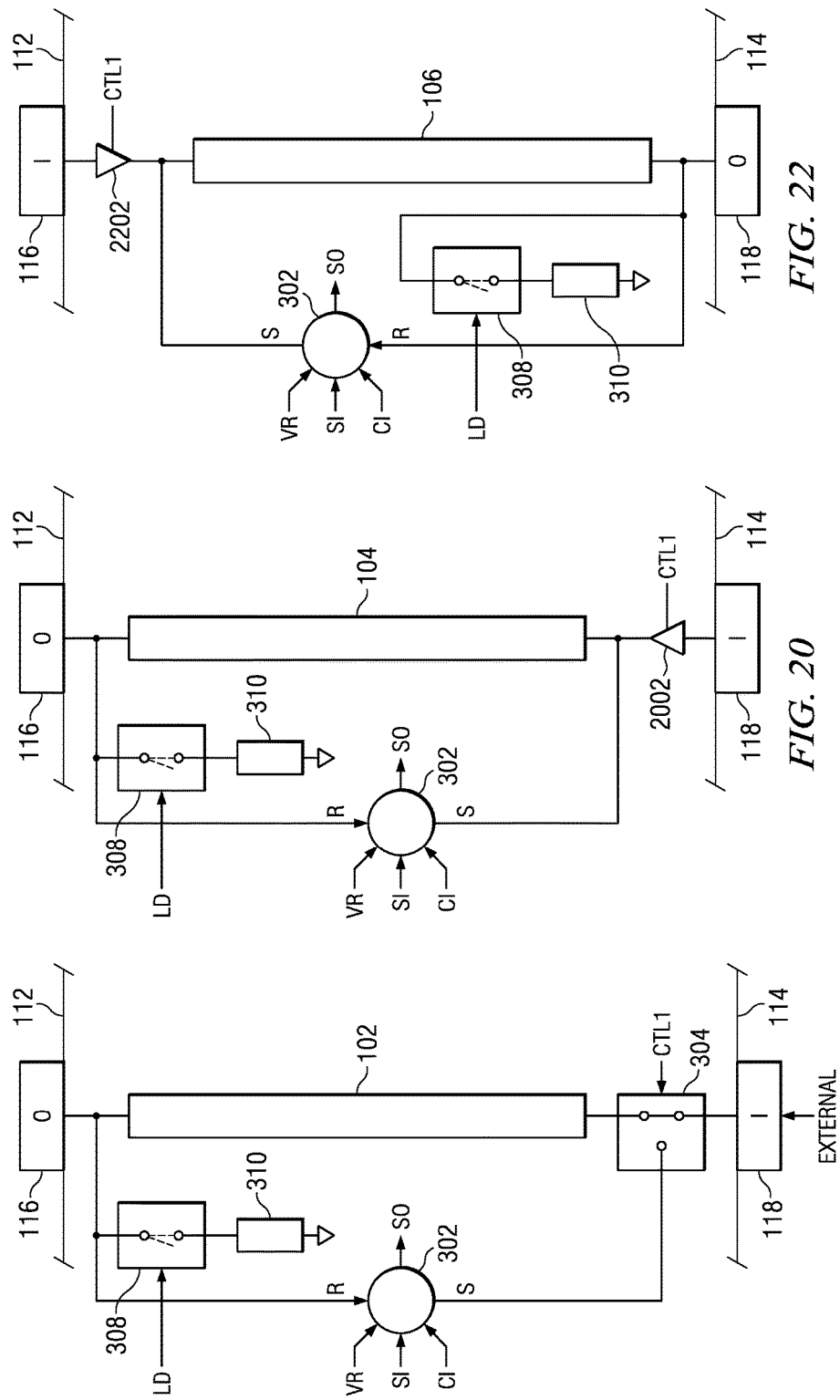

SCAN CELL COUPLED TO VIA ENDS, BUFFER COUPLED TO VIA

RELATED APPLICATIONS

This application is a Divisional of prior application Ser. No. 15/386,970, filed Dec. 21, 2016, now U.S. Pat. No. 9,824,947, issued Nov. 21, 2017;

Which was a divisional of prior application Ser. No. 15/182,817, filed Jun. 15, 2016, now U.S. Pat. No. 9,559,025, issued Jan. 31, 2017;

Which was a divisional of prior application Ser. No. 13/712,459, filed Dec. 12, 2012; now abandoned;

And claims priority from Provisional Application No. 61/577,401, filed Dec. 19, 2011.

This disclosure is related to pending TI patent TI-71609 which is incorporated herein by reference.

FIELD OF THE DISCLOSURE

This disclosure relates generally to die having through silicon/substrate vias (TSVs) and specifically to the testing of the TSVs.

BACKGROUND OF THE DISCLOSURE

Integrated circuit die may be designed for stacking using TSVs. TSVs are vertical conductive paths formed between the bottom surface of the die and top surface of the die. TSVs may be formed in the die using conductive material, such as but not limited to copper. TSVs allow thousands or tens of thousands of vertical connections to be made between the dies in a stack. The advantage of stacking die using TSVs over older approaches, such as die stacking based on peripheral bond wire connections, is a greater number of higher speed interconnects may exist between die in a stack. Also the physical size of the die stack is reduced since the TSV connections are made between the bottom and top surfaces of the die, i.e. the die do not need a periphery connection area.

FIG. 1 illustrates a die 100 including various forms of TSVs 102-110. Each TSV forms a signaling path between the bottom surface 114 of the die and the top surface 112 of the die. The signals propagated on the paths may be analog or digital signals. As seen each TSV 102-110 is coupled to a contact point 118 on the bottom surface of the die and a contact point 116 on the top surface die. The contact points could be for example, but not limited too, a metal pad or a micro bump.

TSV 102 forms a non-buffered input and/or output (I/O) path between contact point 118 on the bottom surface 114 of the die and contact point 116 on the top surface 112 of the die. TSV 104 and buffer 120 form a buffered input (I) path from contact point 118 of the bottom surface 114 of the die to contact point 116 on the top surface 112 of the die. TSV 106 and buffer 122 form a buffered input (I) path from contact point 116 of the top surface 112 of the die to contact point 118 on the bottom top surface 114 of the die. TSV 108 and buffers 124 and 126 form a doubled buffered input (I) path from contact point 118 on the bottom surface 114 of the die to contact point 116 on the top surface 112 of the die. TSV 110 and buffers 128 and 130 form a doubled buffered input (I) path from contact point 116 on the top surface 112 of the die to contact point 118 on the bottom surface 114 of the die.

During the manufacture of Die 100, each TSV 102-110 path should be tested for connectivity to insure signals may be passed between contact points 118 on the bottom surface of the die and contact points 116 on the top surface of the die. If die 100 had ten thousand TSVs to test, a die tester would have to have the resources to test all ten thousand TSVS, which can be a very expensive proposition.

FIG. 2 illustrates an example of an upper die 100 stacked on top of a lower die 100. The die are connected via the TSV 102-110 contact points 116 on the top surface 112 of the lower die and the TSV 102-110 contact points 118 on the bottom surface 114 of the upper die. TSVs 102 of the lower and upper die form a non-buffered I/O path between the contact point 118 of the lower die and the contact point 116 of the upper die. TSVs 104 of the lower and upper die form a buffered input path from the contact point 118 of the lower die to the contact point 116 of the upper die. TSVs 106 of the lower and upper die form a buffered input path from the contact point 116 of the upper die to the contact point 118 of the lower die. TSVs 108 of the lower and upper die form a double buffered input path from the contact point 118 of the lower die to the contact point 116 of the upper die. TSVs 110 of the lower and upper die form a double buffered input path from the contact point 116 of the upper die to the contact point 118 of the lower die. While this example shows two die 100 being stacked, additional die 100 may also be included in the stack.

After stacking the Die 100, each stacked TSV 102-110 path should be tested for connectivity to insure signals may be passed between contact points 118 of the bottom surface of the lower die and contact points 116 on the top surface of the upper die. If the two die 100 had ten thousand TSVs to test, a stack die tester would have to have the resources to test all ten thousand TSVS, which can be a very expensive proposition.

BRIEF SUMMARY OF THE DISCLOSURE

The following disclosure describes a method and apparatus for testing TSV paths in a die or in a stack of die using a scan architecture that includes circuits and scan cells adapted for testing TSV paths. Advantageously, the scan architecture may be accessed with a minimum number of contacts and using very low cost testers.

BRIEF DESCRIPTION OF THE VIEWS OF THE DRAWINGS

FIG. 16 illustrates a TSV with test circuitry according to the disclosure.

FIG. 20 illustrates a TSV with test circuitry according to the disclosure.

FIG. 22 illustrates a TSV with test circuitry according to the disclosure.

FIG. 26 illustrates a TSV with test circuitry according to the disclosure.

FIG. 28 illustrates a TSV with test circuitry according to the disclosure.

DETAILED DESCRIPTION OF THE DISCLOSURE

Figure 1:
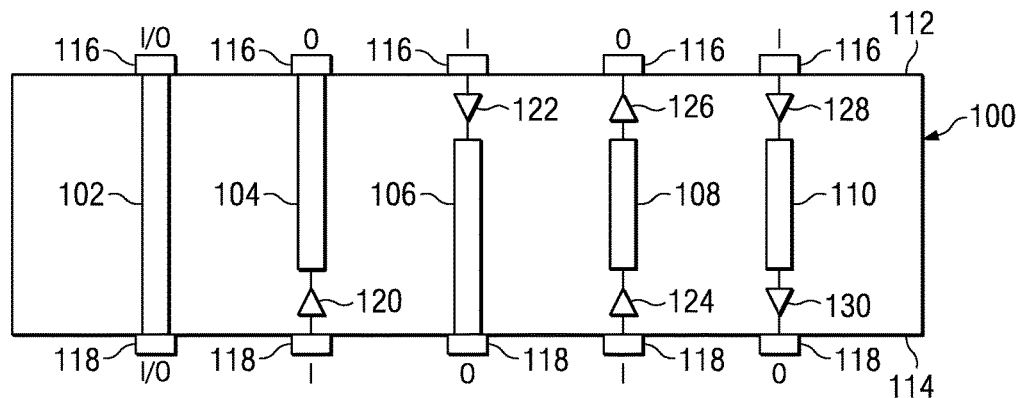
FIG. 1 illustrates a die with TSVs and contact points.
Figure 2:
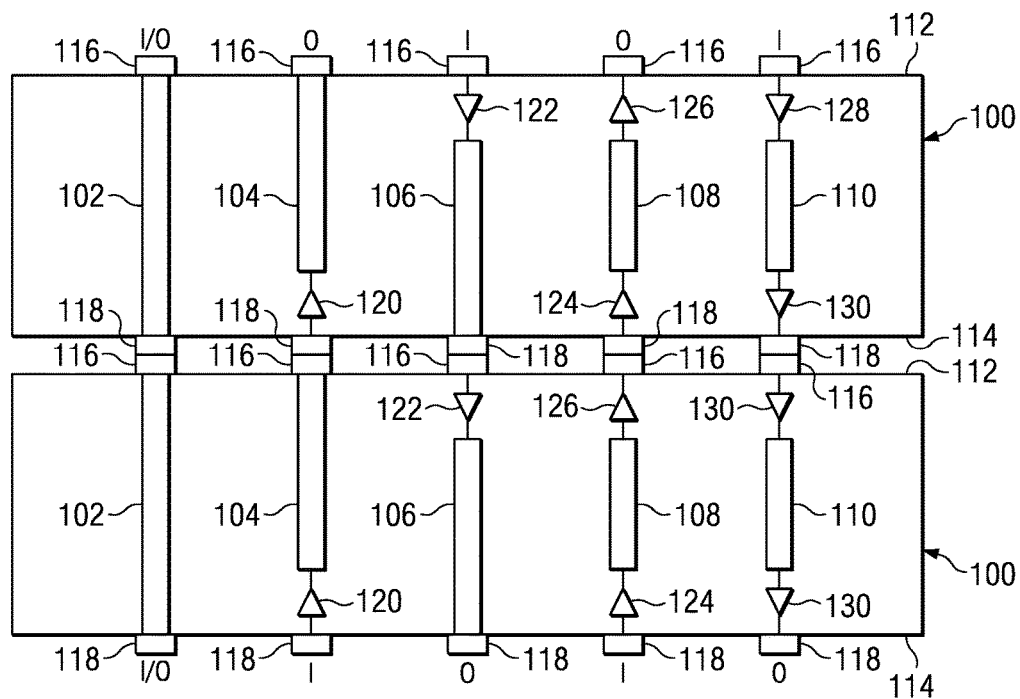
FIG. 2 illustrates a stack of die with TSVs and contact points.
Figure 3:
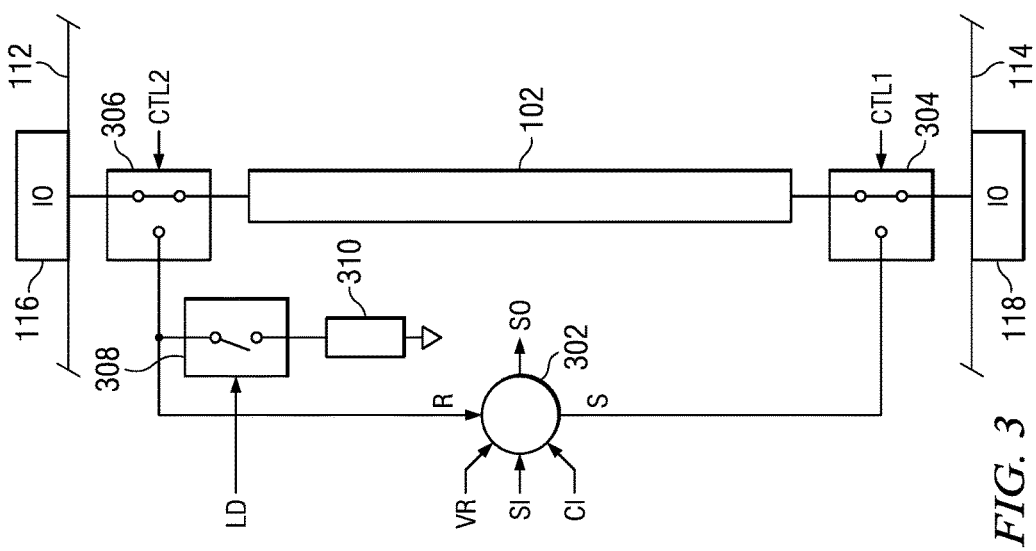
FIG. 3 illustrates a TSV with test circuitry according to the disclosure.

FIG. 3 illustrates how TSV 102 of FIG. 1 is adapted with test circuitry according to the disclosure. The test circuitry includes a scan cell 302, a switch 304, a switch 306, a switch 308 and a load resistor 310. The scan cell 302 has a test response (R) input, a voltage reference (VR) input, a scan input (SI), control inputs (CI), a scan output (SO) and a test stimulus (S) output. Switch 304 has a first terminal connected to the TSV 102, a second terminal connected to contact point 118, a third terminal connected to the stimulus (S) output of the scan cell and a control 1 (CTL1) input. Switch 306 has a first terminal connected to the TSV 102, a second terminal connected to contact point 116, a third terminal connected to the response (R) input of the scan cell and a control 2 (CTL2) input. Switch 308 has a first terminal connected to the third terminal of switch 306, a second terminal connected to load resistor 310 and a load (LD) control input. The load resistor has a first terminal connected to the second terminal or switch 308 and a second terminal connected to ground.

In FIG. 3, the switch 304 is shown being controlled by CTL1 to connect contact point 118 to TSV 102 and switch 306 is shown being controlled by CTL2 to connect TSV 102 to contact point 116. This arrangement allows the TSV to operate in its functional path mode of transferring signals between contact points 118 and 116. Switches 304 and 306 are low impedance switches that do not significantly add impedance to the TSV signaling path.

Figure 4:
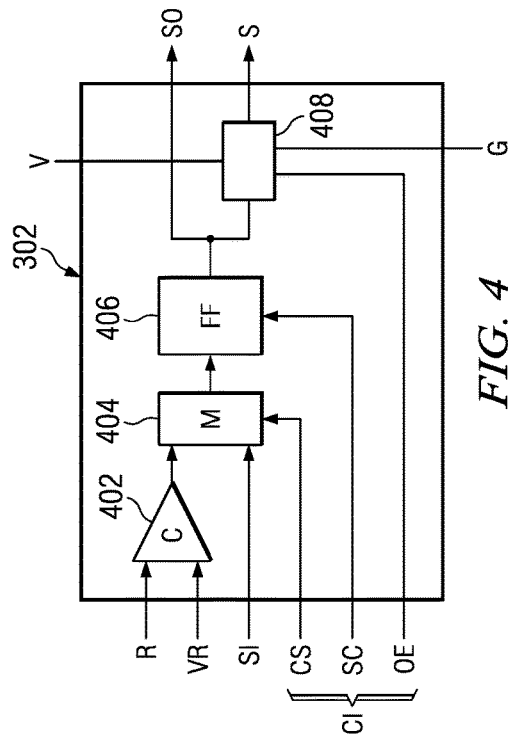
FIG. 4 illustrates a TSV scan cell according to the disclosure.

FIG. 4 illustrates an example implementation of scan cell 302, including a comparator (C) 402, a multiplexer (M) 404, a flip flop (FF) 406 and a stimulus output circuit 408, all connected as shown. Scan cell 302 of FIG. 4 is similar to the scan cell of FIG. 3 in the referenced pending TI patent TI-71609. Comparator 402 has inputs for the response (R) input and voltage reference (VR) input and an output. Multiplexer 404 has inputs for the output of the comparator, the scan input (SI), a capture and shift (CS) input and an output. The FF 406 has an input for the output of the multiplexer, a scan clock (SC) input and an output connected to the serial output (SO) of the scan cell 302. The stimulus output circuit has an input for the output of the FF, an output enable (OE) input and an output connected to the stimulus (S) output of the scan cell 302. The stimulus output circuit also has connections to a selectable voltage (V) reference level and a ground (G) reference level that are used to provide the stimulus (S) output. The CS, SC and OE signals come from the CI bus.

When accessed, scan cell 302 operates in either a capture or shift mode. The capture and shift operation modes of the scan cell are controlled by the control inputs (CI) to the scan cell. During capture operations, the output of comparator 402 is selected to be loaded into FF 406 by the SC input, via multiplexer 404. During shift operations, FF 406 is controlled to shift data from SI to SO by the SC input, via multiplexer 404. During either the capture or shift operation, the stimulus output circuit 408 may be enabled or disabled by the OE input. If disabled, the data contained in FF 406 will not be produce a stimulus (S) output from the scan cell 302. If enabled, the data contained in FF 306 will produce a stimulus (S) output from the scan cell 302. During all capture operations, the response (R) voltage input to the scan cell 302 will be loaded into FF 406. The VR input to comparator 402 is set to a desired voltage reference level that will digitize the response (R) voltage input to a logical one or zero to be loaded into FF 406 via multiplexer 404.

While FIG. 4 shows one example implementation of a scan cell 302, the disclosure is not limited to this one example scan cell implementation. Indeed other scan cell implementations may be devised. The only thing that is required in the scan cell is the ability to digitize the response (R) voltage input against a voltage reference and the ability to either drive or not drive a selectable voltage level and ground level on the stimulus (S) output. Further, while a ground level is shown and described in regard to FIG. 4, the ground level may be replaced with a second voltage level that is different from the other voltage level.

Figure 5:
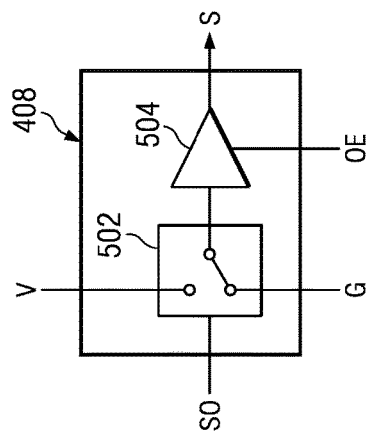
FIG. 5 illustrates a voltage output circuit of the scan cell of FIG. 4, according to the disclosure.

FIG. 5 illustrates on example implementation of the stimulus output circuit 408, including a switch 502 and a unity gain operational amplifier 504. Switch 502 has a first terminal connected to a selectable voltage (V) level, a second terminal connected to ground (G), a third terminal connected to the input of amplifier 504 and a control input connected to SO of FF 406. Amplifier 504 has an input connected to the third terminal of switch 502, an output connected to the stimulus (S) output of scan cell 302 and an output control input connected to the OE signal of scan cell 302. If the OE signal is in a first state, the amplifier output will be disabled. If the OE signal is in a second state the amplifier output will be enabled. If the amplifier output is enabled and the SO input to switch 502 is high, the amplifier will output the voltage (V) level on the first terminal of the switch 502. If the amplifier output is enabled and the SO input to switch 502 is low, the amplifier will output the ground (G) level on the second terminal of the switch 502. While a logic high outputs a voltage (V) and logic low outputs a ground (G), the disclosure is not limited to that mode of operation. Indeed, a logic high could output a ground (G) level and a logic low could output voltage (V) level if so desired.

While FIG. 5 shows one example implementation of a stimulus output circuit 408, the disclosure is not limited to this one example stimulus output circuit implementation. Indeed other stimulus output circuits may be devised. The only thing that is required in the stimulus output circuit is the ability to output a selected voltage level or a ground level on the stimulus (S) output and the ability to disable the stimulus (S) output from outputting any voltage or ground levels. Further, while a ground level is shown and described in regard to FIG. 5, the ground level may be replaced with a second voltage level that is different from the other voltage level.

Figure 6:
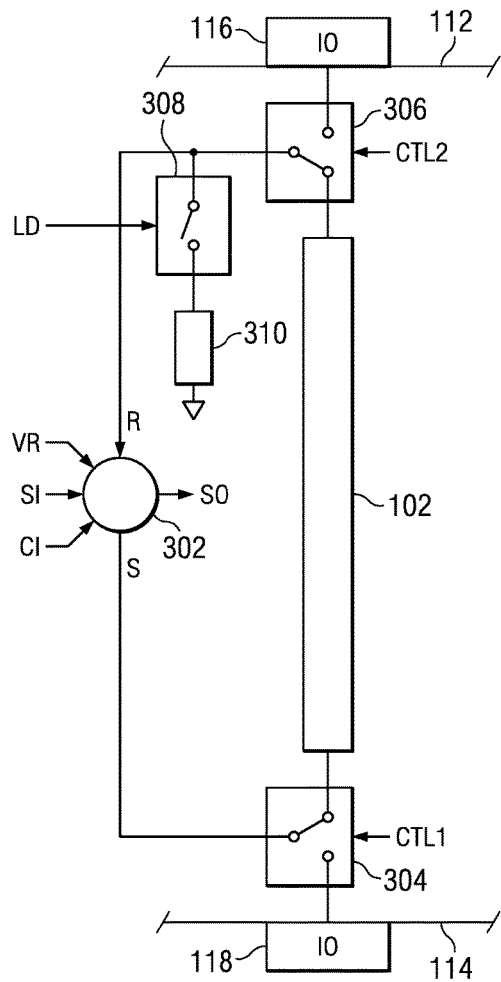
FIG. 6 illustrates a TSV with test circuitry according to the disclosure.

FIG. 6 illustrates the switch positions when testing the TSV 102 for signaling, continuity and shorts. As seen switch 304 is set the connect the S output of the scan cell to the bottom end of the TSV, switch 306 is set to connect the R input of the scan cell to the top end of the TSV and switch 308 is open. During test the OE input to the scan cell is set to enable the stimulus output circuit 408. When a logic 1 is shifted into the scan cell a voltage potential (level) is applied to the bottom of the TSV. During the capture operation the voltage potential on top of the TSV is input to the scan cell, via the R input, digitized against the VR input and loaded into FF 406 to be shifted out during the next shift operation. When a logic 0 is shifted into the scan cell a ground potential (level) is applied to the bottom of the TSV. During the capture operation the voltage on top of the TSV is input to the scan cell, via the R input, digitized against the VR input and loaded into FF 406 to be shifted out during the next shift operation. The capture and shift operations of the scan cell may be repeated with different VR input settings to test for TSV continuity and shorts between TSVs.

Figure 7:
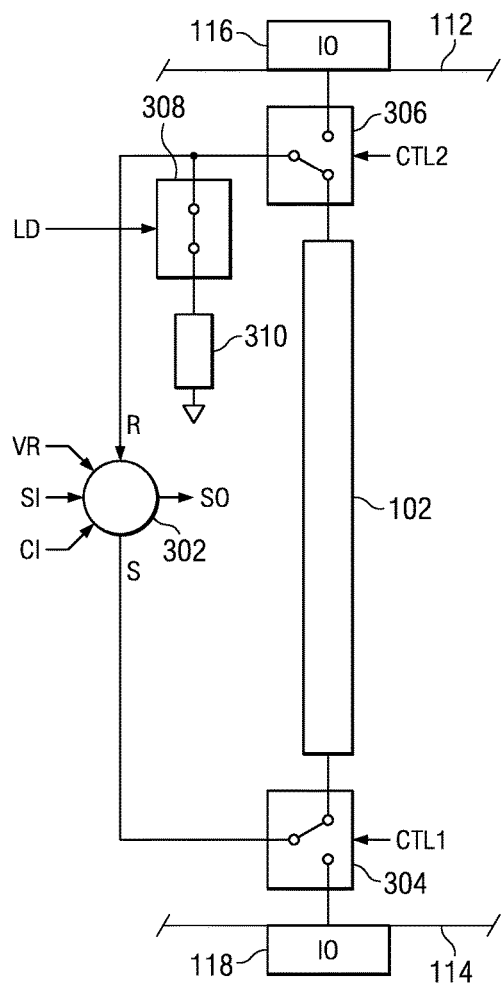
FIG. 7 illustrates a TSV with test circuitry according to the disclosure.

FIG. 7 illustrates the switch positions when testing the resistance of TSV 102. The only difference between FIG. 7 and FIG. 6 is that switch 308 is closed to place the load resistor on the R input to the scan cell. Once again, and as described in FIG. 6 logic ones and zeros are scanned into the scan cell to output voltage and ground potentials to the bottom of the TSV and capture operations are performed to digitize the voltage and ground potentials responses at the top of the TSV. A typical impedance of a good TSV is about 50 milli-ohms. By placing a small load resistor on the R path to the scan cell and using the VR input, it is possible to digitize the voltage drop across the load resister and determined if the TSV resistance is within an acceptable range of resistance. Multiple capture and shift operations may be performed with different VR settings to help determine the TSV resistance.

The voltage potential applied from the S output of the scan cell may need to be decreased during TSV resistance testing, to lessen the current through the TSVs and load resistors. An example circuit for selecting a high or low voltage level at the V terminal of the stimulus output circuit will be described in regard to FIG. 35.

Figures 8, 9:
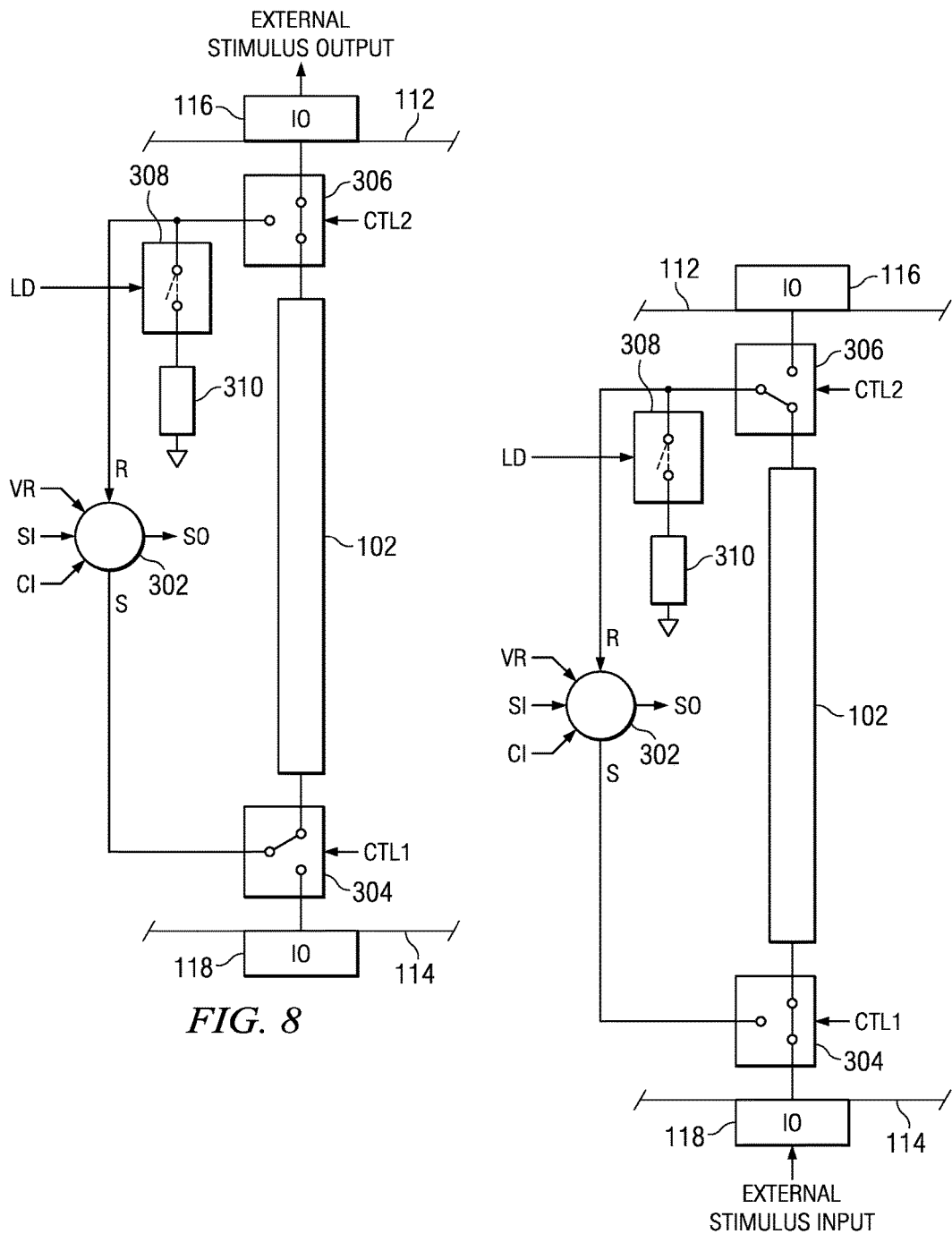
FIG. 8 illustrates a TSV with test circuitry according to the disclosure.
FIG. 9 illustrates a TSV with test circuitry according to the disclosure.

FIG. 8 is provided to illustrate the 304 and 306 switch settings when it is desired to pass the voltage and ground potentials from the S output of the scan cell to contact point 116 on the top surface 112 of a die. This arrangement allows the scan cell to provide external stimulus output on contact point 116. Switch 308 may be opened are closed as desired.

FIG. 9 is provided to illustrate the 304 and 306 switch setting when it is desired to pass external stimulus inputs from contact point 118 on the bottom surface 114 of a die to the R input of the scan cell. This arrangement allows the scan cell to digitize an external stimulus input on contact point 118. Switch 308 may be opened or closed as desired.

Figure 10:
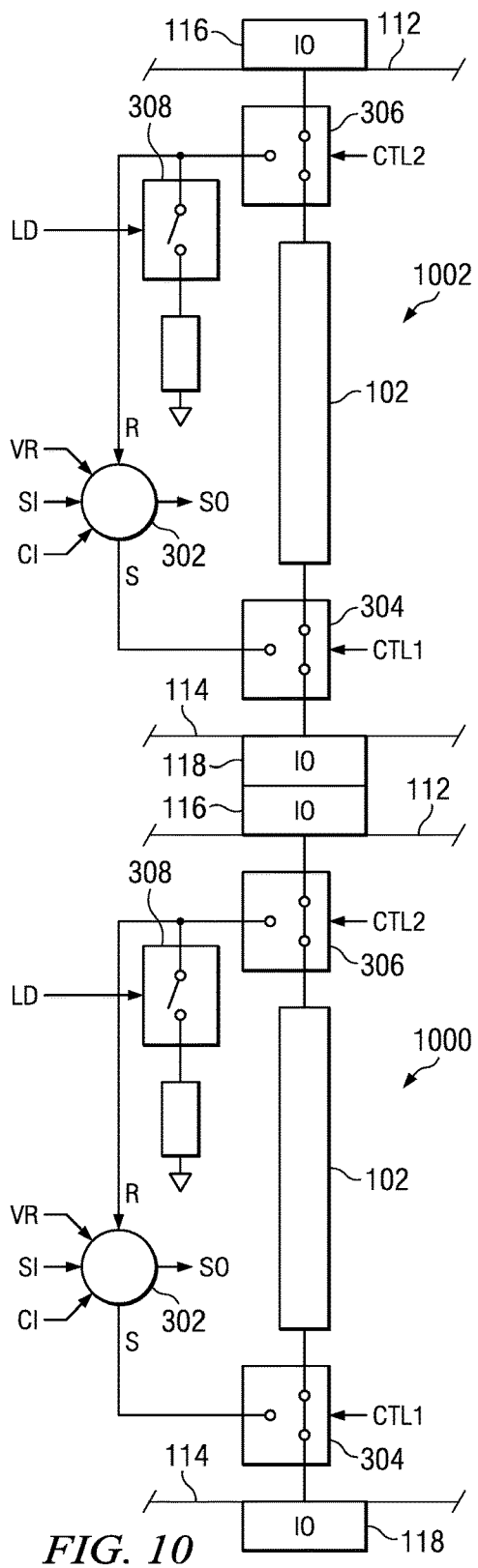
FIG. 10 illustrates a die stack with TSVs and test circuitry according to the disclosure.

FIG. 10 is provided to illustrate an upper die 1002 connected to a lower die 1000 with TSVs and test circuits as described in FIG. 3. In this illustration, switches 304 and 306 of the upper and lower die are set for normal functional operation of the TSVs 102 of the upper and lower die.

Figure 11:
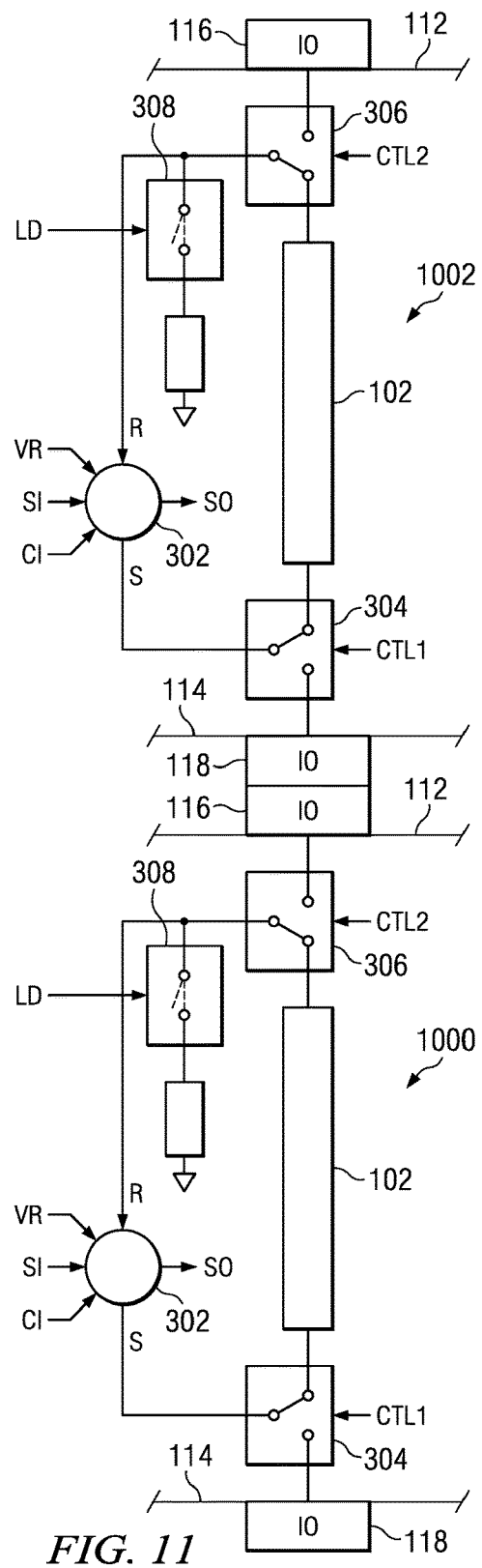
FIG. 11 illustrates a die stack with TSVs and test circuitry according to the disclosure.

FIG. 11 is provided to illustrate an upper die 1002 connected to a lower die 1000 with TSVs and test circuits as described in FIG. 3. In this illustration, switches 304 and 306 of the upper and lower die are set for isolated testing of the TSVs of the upper and lower die as previously described.

Figure 12:
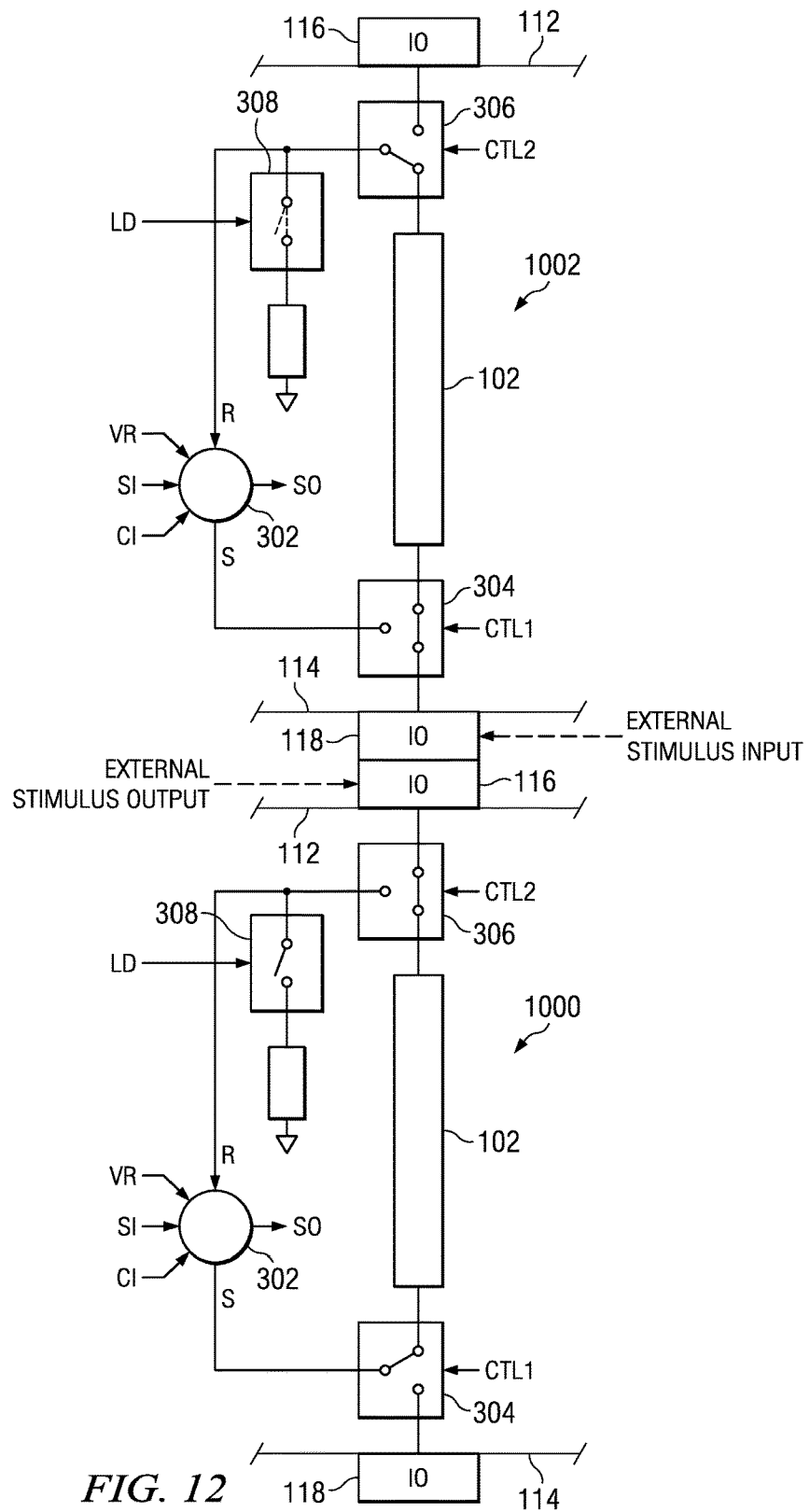
FIG. 12 illustrates a die stack with TSVs and test circuitry according to the disclosure.

FIG. 12 is provided to illustrate an upper die 1002 connected to a lower die 1000 with TSVs and test circuits as described in FIG. 3. In this illustration, switches 304 and 306 of the upper and lower die are set to allow the S output of the scan cell 302 of the lower die to provide a digitizable response input to the scan cell 302 of the upper die. Switch 308 of the upper die may be opened of closed as desired. If closed the combined resistance of the two TSV paths of the lower and upper die may be measured as previously described.

Figure 13:
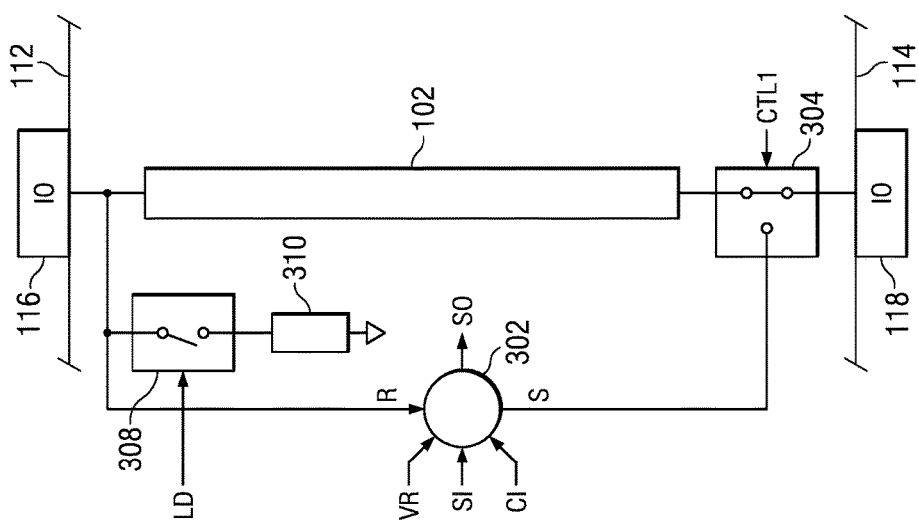
FIG. 13 illustrates a TSV with test circuitry according to the disclosure.

FIG. 13 illustrates an alternate way of how TSV 102 is adapted with test circuitry according to the disclosure. The test circuitry includes a scan cell 302, a switch 304, switch 308 and a load resistor 310. The illustration is identical to the FIG. 3 illustration with the exception that the top of the TSV is directly connected to contact point 116, instead being connected by switch 306. As seen, the R input path to scan cell 302 is directly connected to the connection point between the TSV and contact point 116 and switch 308 is connected to the R input path. Also as seen, since the R input to the scan cell is always connected to the top of the TSV, the signal on the R input is always available to be digitized, captured and shifted out of the scan cell 302.

Figure 14:
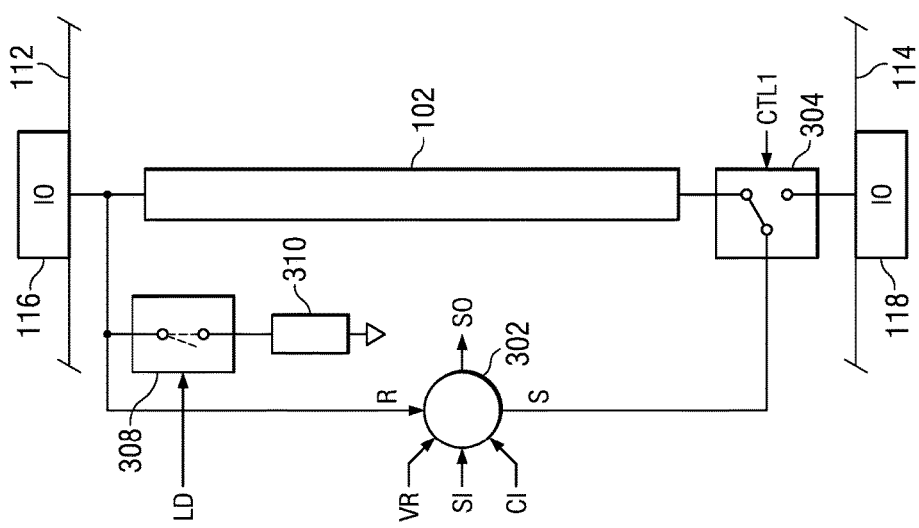
FIG. 14 illustrates a TSV with test circuitry according to the disclosure.

FIG. 14 illustrates the switch 304 position of FIG. 13 when testing the TSV 102 for signaling, continuity, shorts and resistance. As seen, switch 304 is set to connect the S output of the scan cell to the bottom end of the TSV. During test the scan cell operates in capture and shift modes as previously described in regard to FIG. 6 to pass voltage and ground potentials through the TSV from the S output of the scan cell to the R input of the scan cell. Switch 308 is closed during resistance testing of the TSV to apply the load resistance 310 on the R input to the scan cell as described in FIG. 7.

Figure 15:
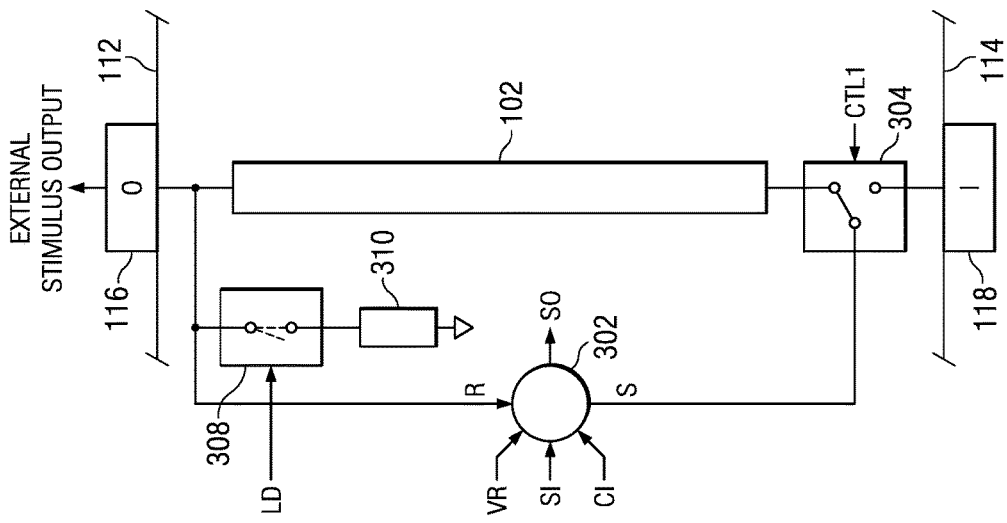
FIG. 15 illustrates a TSV with test circuitry according to the disclosure.

FIG. 15 is provided to illustrate the switch 304 setting of FIG. 13 when it is desired to pass the voltage and ground potentials from the S output of the scan cell to contact point 116 on the top surface 112 of a die. This arrangement allows the scan cell to provide external stimulus output on contact point 116. Switch 308 may be opened are closed as desired.

FIG. 16 is provided to illustrate the switch 304 setting of FIG. 13 when it is desired to pass external stimulus inputs from contact point 118 on the bottom surface 114 of a die to the R input of the scan cell. This arrangement allows the scan cell to digitize an external stimulus input on contact point 118. Switch 308 may be opened or closed as desired.

Figure 17:
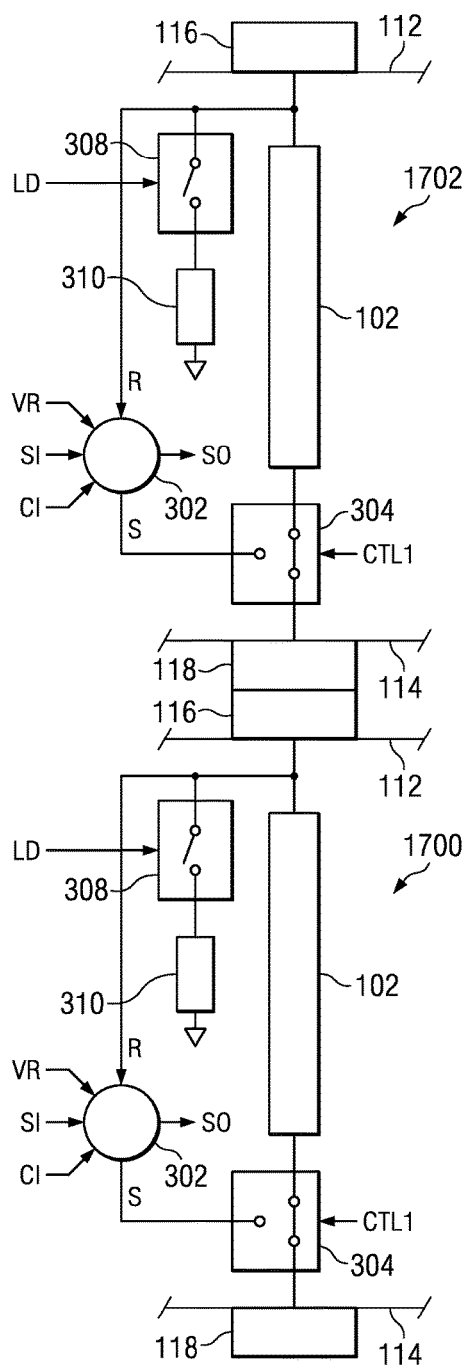
FIG. 17 illustrates a die stack with TSVs and test circuitry according to the disclosure.

FIG. 17 is provided to illustrate an upper die 1702 connected to a lower die 1700 with TSVs and test circuits as described in FIG. 13. In this illustration, switches 304 and 308 of the upper and lower die are set for normal functional operation of the TSVs 102 of the upper and lower die.

Figure 18:
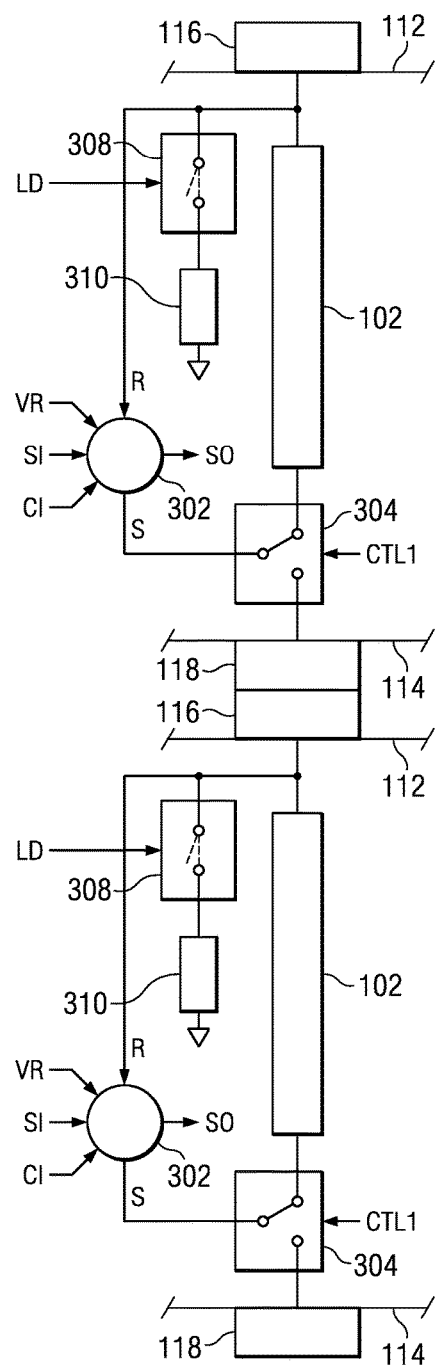
FIG. 18 illustrates a die stack with TSVs and test circuitry according to the disclosure.

FIG. 18 is provided to illustrate an upper die 1702 connected to a lower die 1700 with TSVs and test circuits as described in FIG. 13. In this illustration, switches 304 of the upper and lower die are set for isolated testing of the TSVs of the upper and lower die as previously described. Switches 308 of the upper and lower die may be opened or closed as desired during the test.

Figure 19:
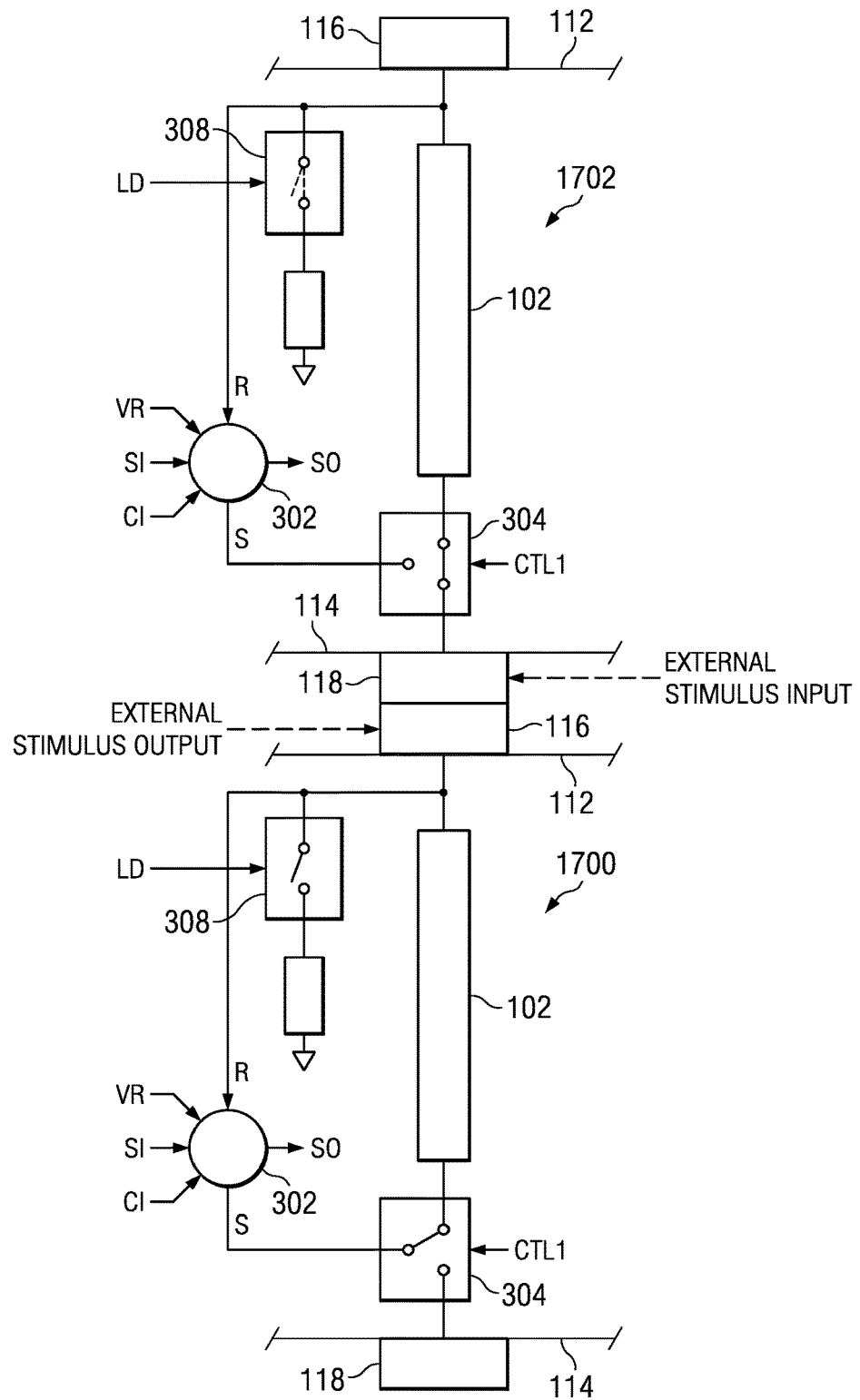
FIG. 19 illustrates a die stack with TSVs and test circuitry according to the disclosure.

FIG. 19 is provided to illustrate an upper die 1702 connected to a lower die 1700 with TSVs and test circuits as described in FIG. 13. In this illustration, switches 304 of the upper and lower die are set to allow the S output of the scan cell 302 of the lower die to provide a digitizable response input to the scan cell 302 of the upper die. Switch 308 of the upper die may be opened of closed as desired. If closed the combined resistance of the two TSV paths of the lower and upper die may be measured as previously described.

FIG. 20 illustrates how TSV 104 of FIG. 1 is adapted with test circuitry according to the disclosure. The test circuitry includes a scan cell 302, a 3-state buffer 2002, a switch 308 and a load resistor 310. The 3-state buffer 2002 replaces buffer 120 of FIG. 1 between contact point 118 and TSV 104. The S output of scan cell 302 is connected to the output of the 3-state buffer. The output of the 3-state buffer 2002 is controlled by CTL1 to one of an enabled state or disabled state. During functional mode, the 3-state buffer is enabled by CTL1 to allow signals to pass from contact point 118 to contact point 116. During signaling, continuity and shorts testing, the 3-state buffer 2002 is disabled by CTL1 and the stimulus output circuit 408 of scan cell 302 is enabled by the OE signal to drive voltage and ground stimulus signals from the scan cell to contact point 116 via TSV 104. Scan cell 302 digitizes, captures and shifts out the voltage and ground stimulus signals present on the R input to scan cell 302. During TSV resistance testing, the 3-state buffer 2002 is disabled by CTL1, the stimulus output circuit 408 of scan cell 302 is enabled to output voltage and ground stimulus signals and switch 308 is closed to place the load resistor 310 on the R input to the scan cell. Scan cell 302 digitizes, captures and shifts out the voltage drop across the load resistor and previously described.

Figure 21:
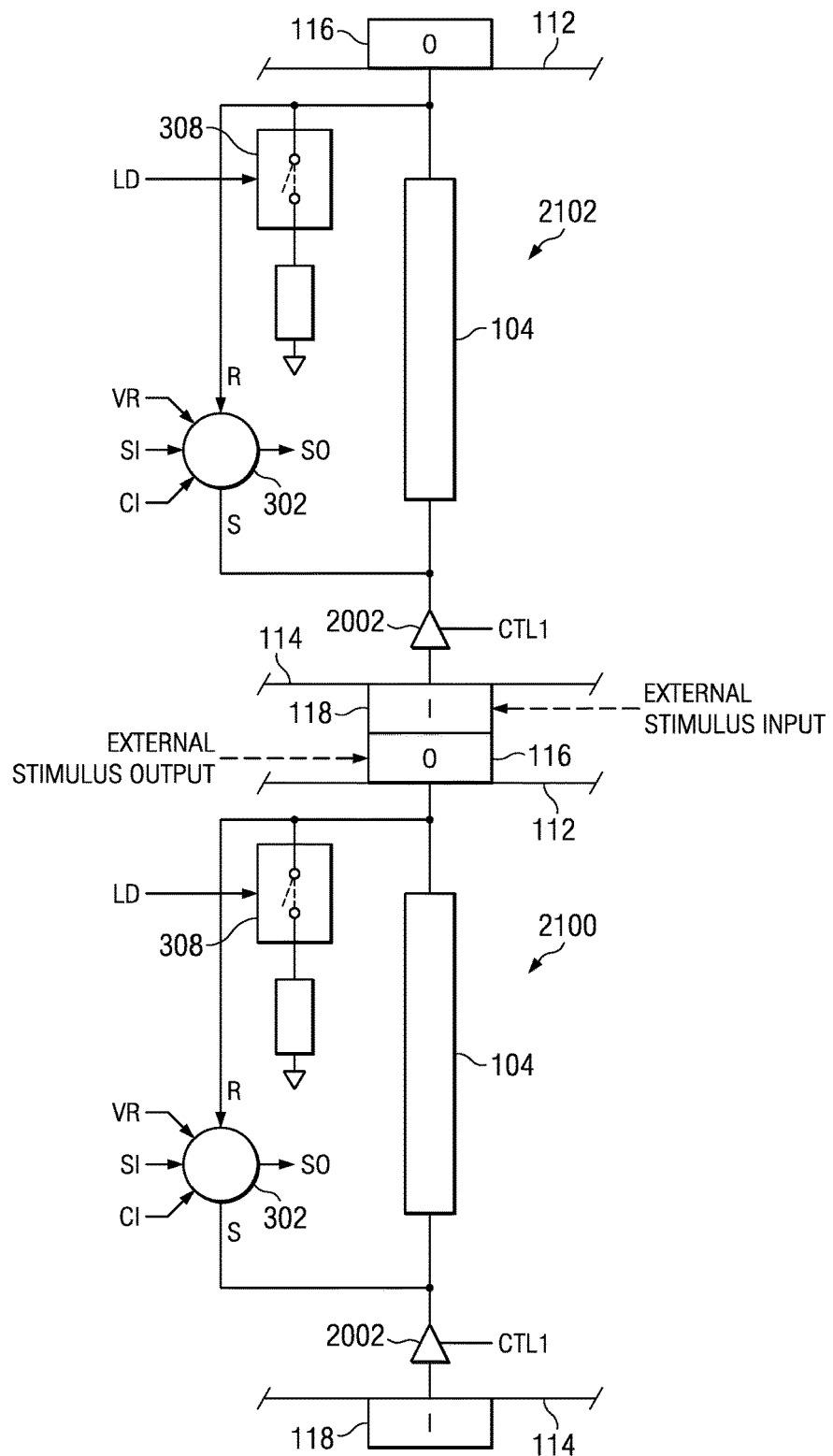
FIG. 21 illustrates a die stack with TSVs and test circuitry according to the disclosure.

FIG. 21 is provided to illustrate an upper die 2102 connected to a lower die 2100 with TSVs and test circuits as described in FIG. 20. The functional and test operation modes are described below.

During functional operation, buffers 2002 of die 2100 and 2102 are enabled, the S outputs of scan cells 302 are disabled and switches 308 are opened. In this mode, functional signals may be passed from contact point 118 of the die 2100 to contact point 116 of die 2102.

During separate testing of the TSVs of die 2100 and 2102, buffers 2002 are disabled, the S outputs of the scan cells 302 are enabled and the scan cells are controlled to perform capture and shift operations. Switch 308 is open during TSV signaling, continuity and shorts testing and closed during TSV resistance testing, as previously described.

During combined testing of the TSVs of die 2100 and 2102, buffer 2002 of die 2102 is enabled, buffer 2002 of die 2100 is disabled, the S output of scan cell 302 of die 2100 is enabled and the S output of scan cell 302 of die 2102 is disabled. The scan cells 302 are operated to perform capture and shift operations. Switches 308 are open during TSV signaling, continuity and shorts testing. One or both of switches 308 may be closed during TSV resistance testing, as previously described.

FIG. 22 illustrates how TSV 106 of FIG. 1 is adapted with test circuitry according to the disclosure. The test circuitry includes a scan cell 302, a 3-state buffer 2202, a switch 308 and a load resistor 310. The 3-state buffer 2202 replaces buffer 122 of FIG. 1 between contact point 116 and TSV 106. The S output of scan cell 302 is connected to the output of the 3-state buffer. The output of the 3-state buffer 2002 is controlled by CTL1 to one of an enabled state or disabled state. During functional mode, the 3-state buffer is enabled by CTL1 to allow signals to pass from contact point 116 to contact point 118. During signaling, continuity and shorts testing, the 3-state buffer 2202 is disabled by CTL1 and the stimulus output circuit 408 of scan cell 302 is enabled by the OE signal to drive voltage and ground stimulus signals from the scan cell to contact point 118 via TSV 106. Scan cell 302 digitizes, captures and shifts out the voltage and ground stimulus signals present on the R input to scan cell 302. During TSV resistance testing, the 3-state buffer 2002 is disabled by CTL1, the stimulus output circuit 408 of scan cell 302 is enabled to output voltage and ground stimulus signals and switch 308 is closed to place the load resistor 310 on the R input to the scan cell. Scan cell 302 digitizes, captures and shifts out the voltage drop across the load resistor and previously described.

Figure 23:
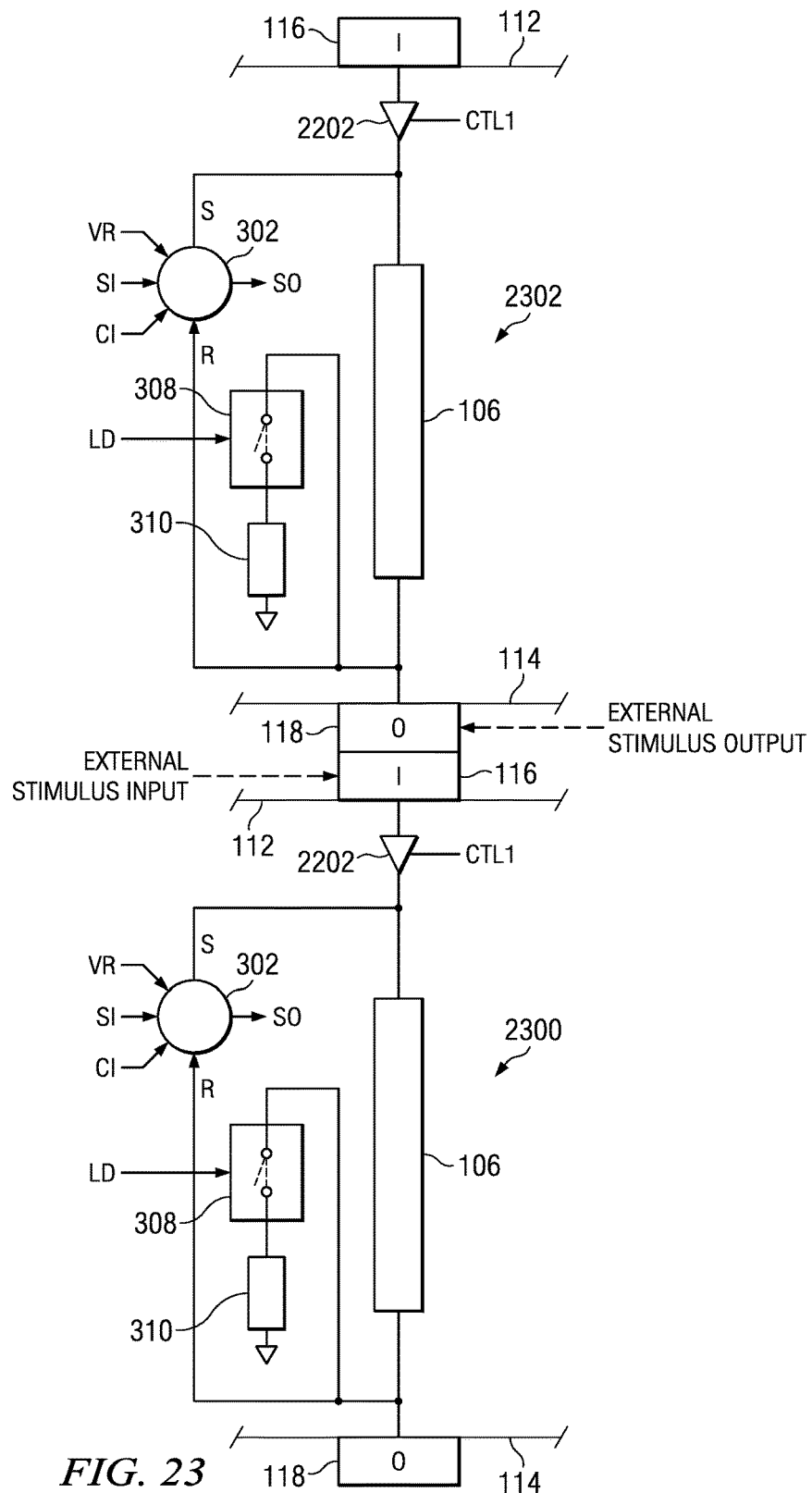
FIG. 23 illustrates a die stack with TSVs and test circuitry according to the disclosure.

FIG. 23 is provided to illustrate an upper die 2302 connected to a lower die 2300 with TSVs and test circuits as described in FIG. 22. The functional and test operation modes are described below.

During functional operation, buffers 2202 of die 2300 and 2302 are enabled, the S outputs of scan cells 302 are disabled and switches 308 are opened. In this mode, functional signals may be passed from contact point 116 of the die 2302 to contact point 118 of die 2300.

During separate testing of the TSVs of die 2300 and 2302, buffers 2202 are disabled, the S outputs of the scan cells 302 are enabled and the scan cells are controlled to perform capture and shift operations. Switch 308 is open during TSV signaling, continuity and shorts testing and closed during TSV resistance testing, as previously described.

During combined testing of the TSVs of die 2300 and 2302, buffer 2202 of die 2300 is enabled, buffer 2202 of die 2302 is disabled, the S output of scan cell 302 of die 2302 is enabled and the S output of scan cell 302 of die 2300 is disabled. The scan cells 302 are operated to perform capture and shift operations. Switches 308 are open during TSV signaling, continuity and shorts testing. One or both of switches 308 may be closed during TSV resistance testing, as previously described.

Figure 24:
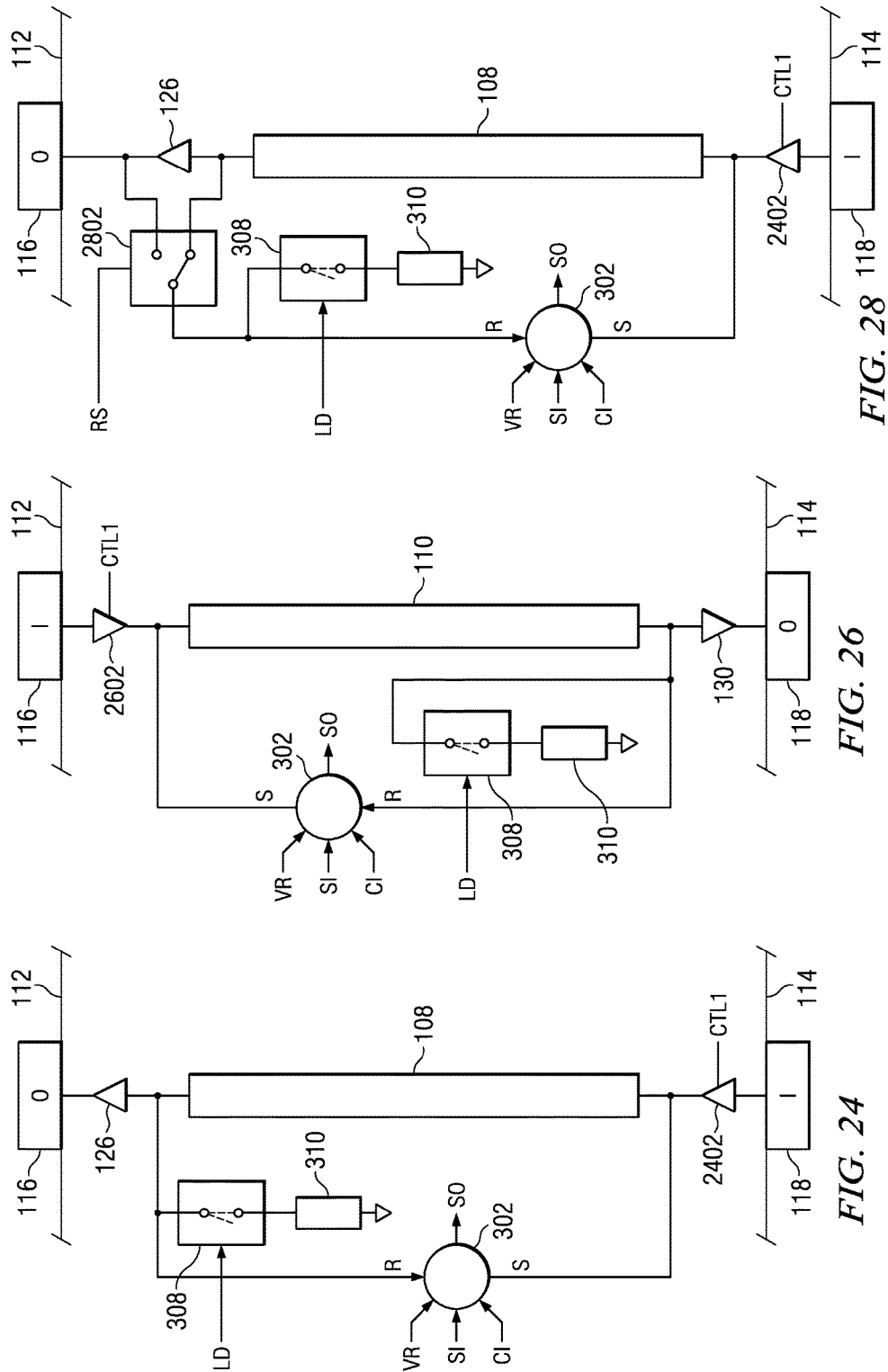
FIG. 24 illustrates a TSV with test circuitry according to the disclosure.

FIG. 24 illustrates how TSV 108 of FIG. 1 is adapted with test circuitry according to the disclosure. The test circuitry includes a scan cell 302, 3-state buffer 2402 and a switch 308 and a load resistor 310. 3-state buffer 2402 replaces buffer 124 of FIG. 1 between contact point 118 and TSV 108. The S output of scan cell 302 is connected to the output of 3-state buffer 2402. The output of 3-state buffer 2402 is controlled by CTL1 to one of an enabled state or disabled state. During functional mode, the 3-state buffer 2402 is enabled by CTL1 to allow signals to pass from contact point 118 to contact point 116. During signaling, continuity and shorts testing, the 3-state buffer 2402 is disabled by CTL1 and the stimulus output circuit 408 of scan cell 302 is enabled by the OE signal to drive voltage and ground stimulus signals from the scan cell to contact point 116 via TSV 108 and buffer 126. Scan cell 302 digitizes, captures and shifts out the voltage and ground stimulus signals present on the R input to scan cell 302. During TSV resistance testing, the 3-state buffer 2402 is disabled by CTL1, the stimulus output circuit 408 of scan cell 302 is enabled to output voltage and ground stimulus signals and switch 308 is closed to place the load resistor 310 on the R input to the scan cell. Scan cell 302 digitizes, captures and shifts out the voltage drop across the load resistor and previously described.

Figure 25:
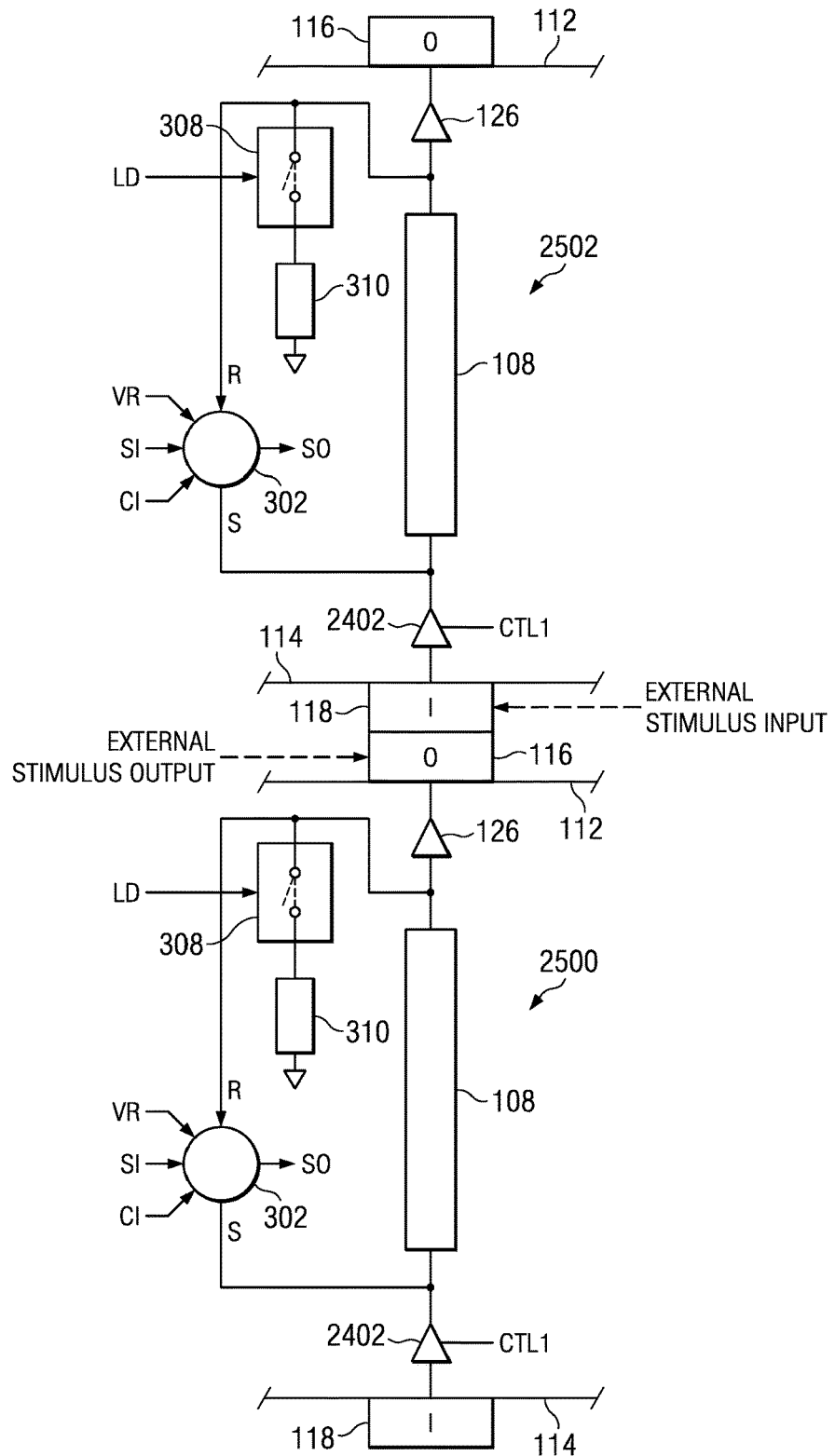
FIG. 25 illustrates a die stack with TSVs and test circuitry according to the disclosure.

FIG. 25 is provided to illustrate an upper die 2502 connected to a lower die 2500 with TSVs and test circuits as described in FIG. 24. The functional and test operation modes are described below.

During functional operation, buffers 2402 of die 2500 and 252 are enabled, the S outputs of scan cells 302 are disabled and switches 308 are opened. In this mode, functional signals may be passed from contact point 118 of the die 2500 to contact point 116 of die 2502.

During separate testing of the TSVs of die 2500 and 2502, buffers 2402 are disabled, the S outputs of the scan cells 302 are enabled and the scan cells are controlled to perform capture and shift operations. Switch 308 is open during TSV signaling, continuity and shorts testing and closed during TSV resistance testing, as previously described.

During combined testing of the TSVs of die 2500 and 2502, buffer 2402 of die 2502 is enabled, buffer 2402 of die 2500 is disabled, the S output of scan cell 302 of die 2500 is enabled and the S output of scan cell 302 of die 2502 is disabled. The scan cells 302 are operated to perform capture and shift operations. Switches 308 are open during TSV signaling, continuity and shorts testing. One or both of switches 308 may be closed during TSV resistance testing, as previously described.

FIG. 26 illustrates how TSV 110 of FIG. 1 is adapted with test circuitry according to the disclosure. The test circuitry includes a scan cell 302, a 3-state buffer 2602, a switch 308 and a load resistor 310. The 3-state buffer 2402 replaces buffer 128 of FIG. 1 between contact point 116 and TSV 110. The S output of scan cell 302 is connected to the output of the 3-state buffer 2602. The output of the 3-state buffer 2602 is controlled by CTL1 to one of an enabled state or disabled state. During functional mode, the 3-state buffer is enabled by CTL1 to allow signals to pass from contact point 116 to contact point 118. During signaling, continuity and shorts testing, the 3-state buffer 2602 is disabled by CTL1 and the stimulus output circuit 408 of scan cell 302 is enabled by the OE signal to drive voltage and ground stimulus signals from the scan cell to contact point 118 via TSV 106 and buffer 130. Scan cell 302 digitizes, captures and shifts out the voltage and ground stimulus signals present on the R input to scan cell 302. During TSV resistance testing, the 3-state buffer 2602 is disabled by CTL1, the stimulus output circuit 408 of scan cell 302 is enabled to output voltage and ground stimulus signals and switch 308 is closed to place the load resistor 310 on the R input to the scan cell. Scan cell 302 digitizes, captures and shifts out the voltage drop across the load resistor and previously described.

Figure 27:
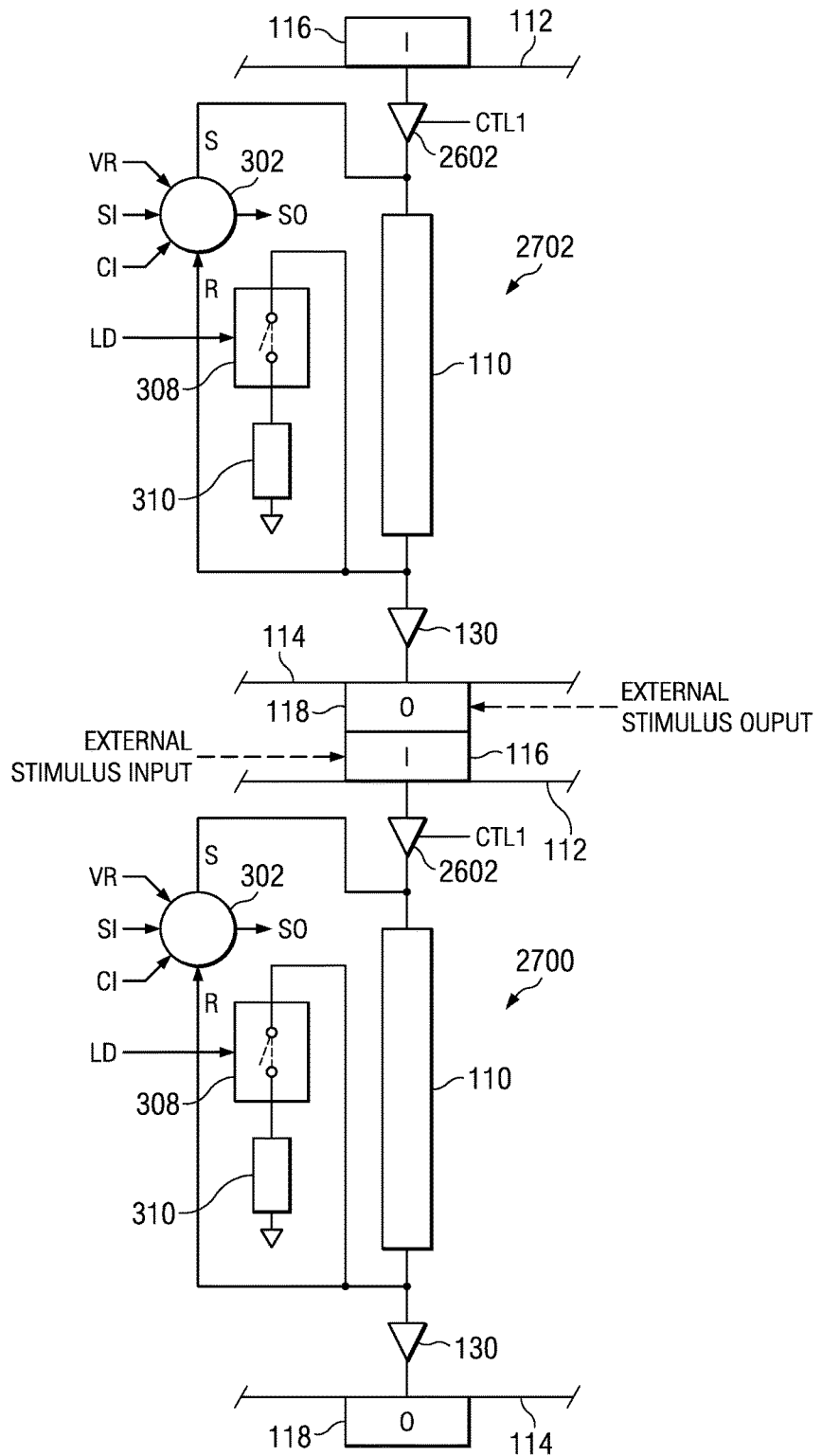
FIG. 27 illustrates a die stack with TSVs and test circuitry according to the disclosure.

FIG. 27 is provided to illustrate an upper die 2702 connected to a lower die 2700 with TSVs and test circuits as described in FIG. 26. The functional and test operation modes are described below.

During functional operation, buffers 2602 of die 2700 and 2702 are enabled, the S outputs of scan cells 302 are disabled and switches 308 are opened. In this mode, functional signals may be passed from contact point 116 of the die 2702 to contact point 118 of die 2700.

During separate testing of the TSVs of die 2700 and 2702, buffers 2602 are disabled, the S outputs of the scan cells 302 are enabled and the scan cells are controlled to perform capture and shift operations. Switch 308 is open during TSV signaling, continuity and shorts testing and closed during TSV resistance testing, as previously described.

During combined testing of the TSVs of die 2700 and 2702, buffer 2602 of die 2700 is enabled, buffer 2602 of die 2702 is disabled, the S output of scan cell 302 of die 2702 is enabled and the S output of scan cell 302 of die 2700 is disabled. The scan cells 302 are operated to perform capture and shift operations. Switches 308 are open during TSV signaling, continuity and shorts testing. One or both of switches 308 may be closed during TSV resistance testing, as previously described.

FIG. 28 illustrates the TSV and test circuitry of FIG. 24 adapted to include a switch 2802. Switch 2802 has a first terminal connected to the connection between TSV 108 and the input of buffer 126, a second terminal connected to the connection between the output of buffer 126 and contact point 116, a third terminal connected to the R input to scan cell 302 and a fourth terminal connected to a response select (RS) control input. When the RS control input is in a first state, the switch couples the first terminal to the third terminal. When the RS control input is a second state, the switch couples the second terminal to the third terminal. When the first terminal is connected to the third terminal, the switch allows testing the TSV 108 as described in FIG. 24. When the second terminal is connected to the third terminal, the switch includes the buffer 126 in the TSV test path for signaling, continuity and shorts testing.

Figure 29:
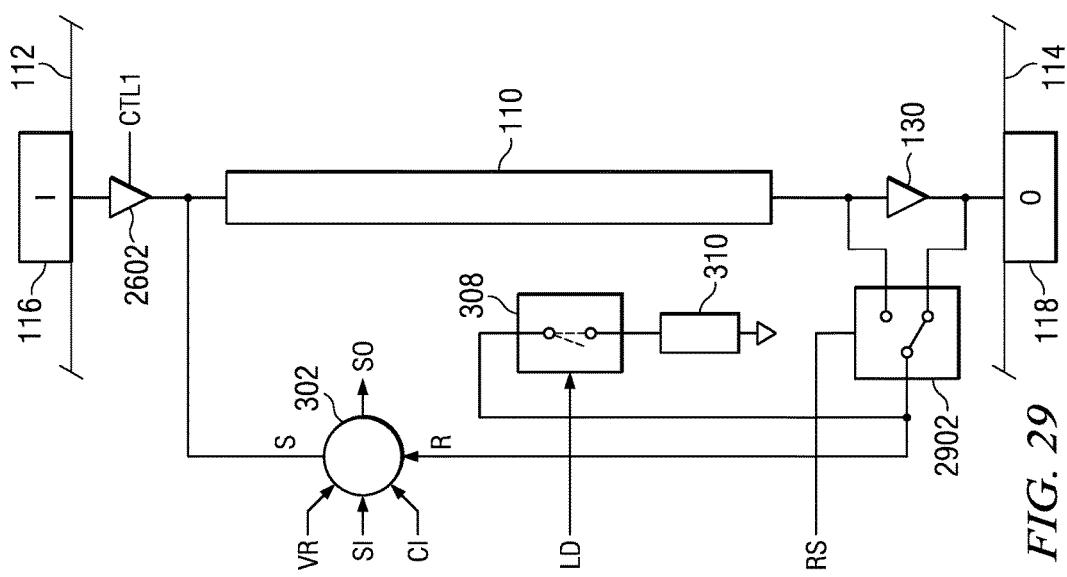
FIG. 29 illustrates a TSV with test circuitry according to the disclosure.

FIG. 29 illustrates the TSV and test circuitry of FIG. 26 adapted to include a switch 2902. Switch 2902 has a first terminal connected to the connection between TSV 110 and the input of buffer 130, a second terminal connected to the connection between the output of buffer 130 and contact point 118, a third terminal connected to the R input to scan cell 302 and a fourth terminal connected to the RS control input. When the RS control input is in a first state, the switch couples the first terminal to the third terminal. When the RS control input is a second state, the switch couples the second terminal to the third terminal. When the first terminal is connected to the third terminal, the switch allows testing the TSV 110 as described in FIG. 26. When the second terminal is connected to the third terminal, the switch includes the buffer 130 in the TSV test path for signaling, continuity and shorts testing.

Figure 30:
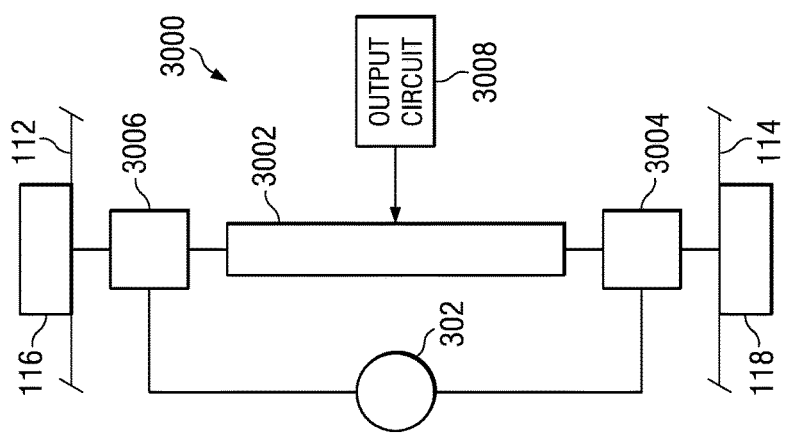
FIG. 30 illustrates a TSV with test circuitry connected to an output circuit of a die.

FIG. 30 illustrates die 3000 including a TSV 3002 and the scan cell 302 of the disclosure. TSV 3002 could be any one of the TSVs 102, 104, 106, 108 or 110. TSV 3002 is coupled to contact point 118 via a connection mechanism 3004, which could be the switch 304 of FIG. 3, the 3-state buffer 2002 of FIG. 20, a direct connection as shown in FIG. 22 or the buffer 130 of FIG. 26. The TSV is coupled to contact point 116 via a connection mechanism 3006, which could be switch 306 of FIG. 3, the 3-state buffer 2202 of FIG. 22, a direct connection as shown in FIG. 13 or buffer 126 of FIG. 24. The scan cell 302 can be connected in any arrangement shown herein. For example the S output of the scan cell may be connected to connection circuit 3004 and the R input to the scan cell may be connected to connection circuit 3006. Alternately, the S output of the scan cell may be connected to connection circuit 3006 and the R input to the scan cell may be connected to connection circuit 3004. A functional output circuit 3008 in die 3000 has an output connected to and driving TSV 3002. When TSV 3002 is being tested by scan cell 302, the output of the circuit 3008 will interfere with the test.

Figure 31:
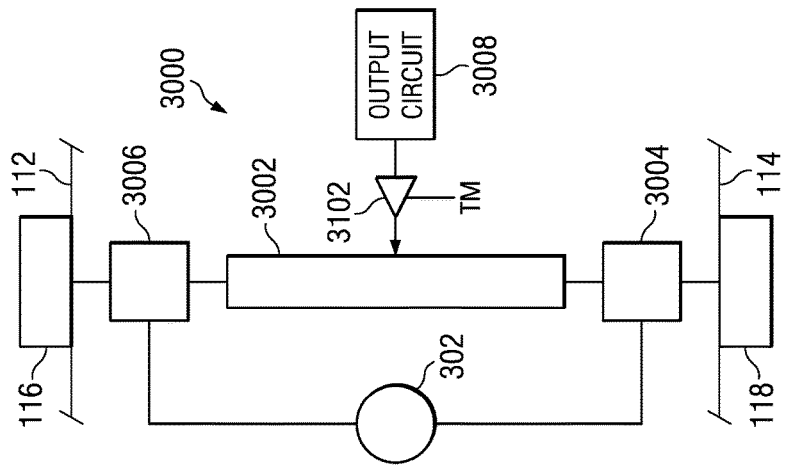
FIG. 31 illustrates the TSV with test circuitry of FIG. 30 with a test mode (TM) controlled 3-state buffer/amplifier inserted the output signal path according to the disclosure.

FIG. 31 illustrates how the die 3000 of FIG. 30 is modified to prevent the output of circuit 3008 from interfering with the TSV test, according to the disclosure. The modification includes inserting a 3-state buffer/amplifier 33102 in the output path of circuit 3008. The buffer/amplifier has a Test Mode (TM) input to enable or disable the buffer/amplifier. When the TSV is in functional mode, the TM signal will be set to enable the buffer/amplifier to pass the output of circuit 3008 to the TSV. When the TSV is in test mode, the TM signal will be set to disable the buffer/amplifier to block the output of circuit 3008 from the TSV.

Figure 32:
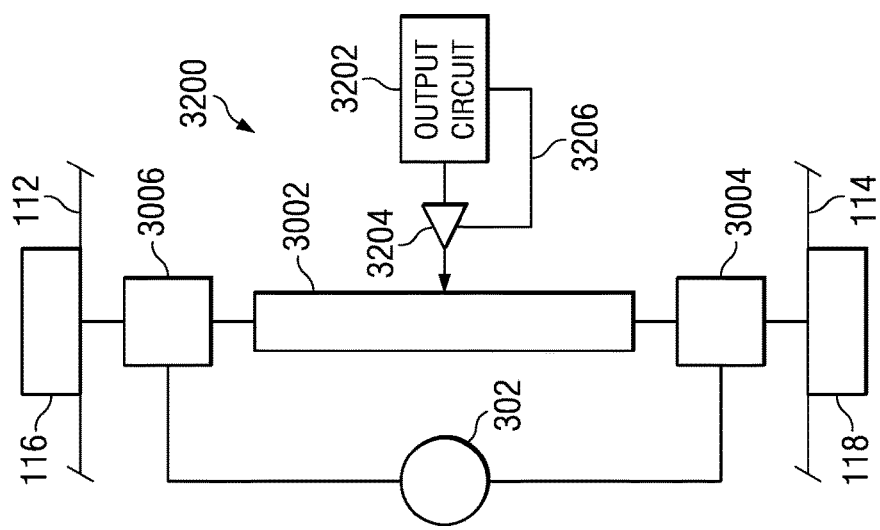
FIG. 32 illustrates a TSV with test circuitry connected to an output circuit of a die via a 3-state buffer/amplifier controlled by a signal from the output circuit.

FIG. 32 illustrates die 3200 including a TSV 3002 and the scan cell 302 of the disclosure. TSV 3002 could be any one of the TSVs 102, 104, 106, 108 or 110. TSV 3002 is coupled to contact point 118 via a connection mechanism 3004, which could be the switch 304 of FIG. 3, the 3-state buffer 2002 of FIG. 20, a direct connection as shown in FIG. 22 or the buffer 130 of FIG. 26. The TSV is coupled to contact point 116 via a connection mechanism 3006, which could be switch 306 of FIG. 3, the 3-state buffer 2202 of FIG. 22, a direct connection as shown in FIG. 13 or buffer 126 of FIG. 24. The scan cell 302 can be connected in any arrangement shown herein, as described in FIG. 30. A functional output circuit 3202 in die 3200 has an output connected to TSV 3002 via a 3-state buffer/amplifier 3204. The output circuit 3202 selectively enables and disables the 3-state buffer/amplifier via a control output 3206. When TSV 3002 is being tested by scan cell 302, and if the 3-state buffer/amplifier is enabled, the output of the circuit 3202 will interfere with the test.

Figure 33:
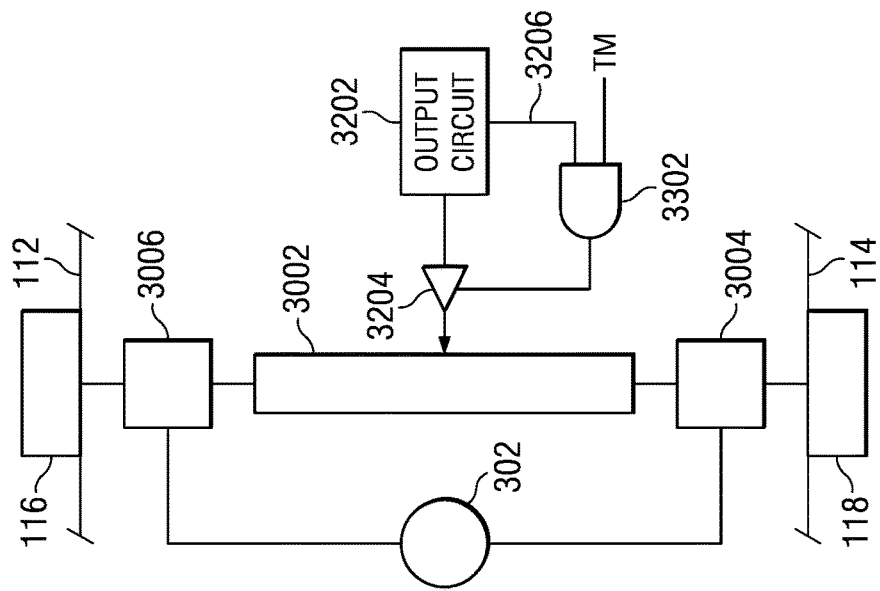
FIG. 33 illustrates the TSV with test circuitry 32 with a gate controlled by a TM signal inserted into 3-state control path of the output circuit according to the disclosure.

FIG. 33 illustrates how the die 3200 of FIG. 32 is modified to prevent the output of circuit 3202 from interfering with the TSV test, according to the disclosure. The modification includes inserting a gating circuit 3302 in the control signal path from circuit 3202 to the 3-state buffer/amplifier 3204. Gating circuit 3302 has an input connected to the control output 3206 of circuit 3202, an input connected to a Test Mode (TM) signal and an output connected to the control input of 3-state buffer/amplifier 3204. When the TSV is in functional mode, the TM signal will be set to allow the control output of circuit 3202 pass through the gating circuit to control the 3-state buffer/amplifier. When the TSV is in test mode, the TM signal will be set to force the output of gating circuit 3302 to a state that disables the 3-state buffer/amplifier from driving the TSV.

Figure 34:
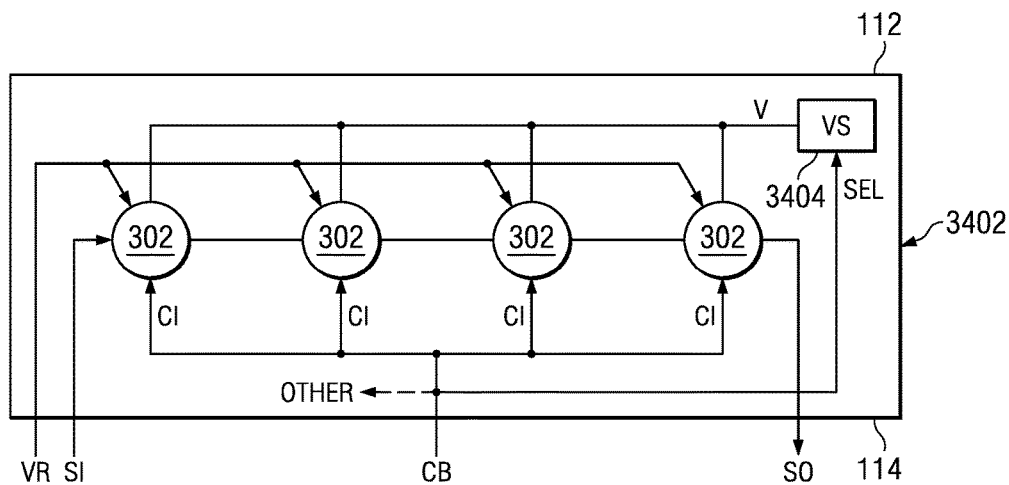
FIG. 34 illustrates a die with TSV scan cells and a voltage select circuit according to the disclosure.

FIG. 34 illustrates a simplified view of a die 3402 where the TSV scan cells 302 in the die are serially connected from an SI input terminal to an SO output terminal on the bottom surface 114 of die 3402 according to the disclosure. The VR inputs to the scan cells 302 are connected to a VR terminal on the bottom surface 114 of the die and CI inputs to the scan cells 302 come from a control bus (CB) set of terminals on the bottom surface 114 to the die. The voltage (V) inputs to the scan cells 302 (see FIGS. 4 and 5) are connected to a voltage output of a voltage select (VS) circuit 3404. The VS circuit receives a select (SEL) input from the CB terminals. The VS circuit outputs first and second voltage levels on the V bus to the scan cells in response to the SEL input. As shown in dotted line, the CB also provides the additional control signals described in this disclosure (i.e. CTL1, CTL2, LD, RS and TM). In response to the CI inputs, the scan cells capture data and shift data from the SI terminal to the SO terminal.

Figure 35:
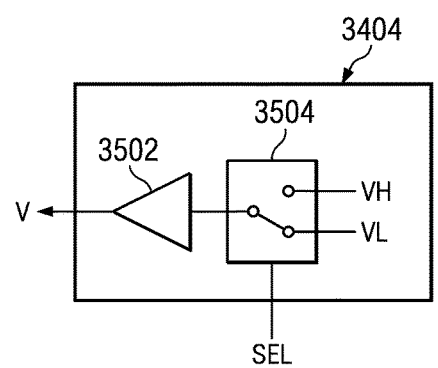
FIG. 35 illustrates an example voltage select circuit of FIG. 34, according to the disclosure.

FIG. 35 illustrates one example of VS circuit 3404 according to the disclosure. The VS circuit includes a unity gain voltage buffer 3502 and a voltage select switch 3504. When SEL is in a first state, switch 3504 couples a Voltage High (VH) source to the input of voltage buffer 3502. The VH level selected when performing TSV connectivity and shorts testing. When SEL is in a second state, switch 3504 coupled a Voltage Low (VL) source to the input of voltage buffer 3502. The VL level is selected when performing TSV resistance testing. Using the VL level during resistance testing advantageously reduces the current flow through the TSVs and load resistors 310.

Figure 36:
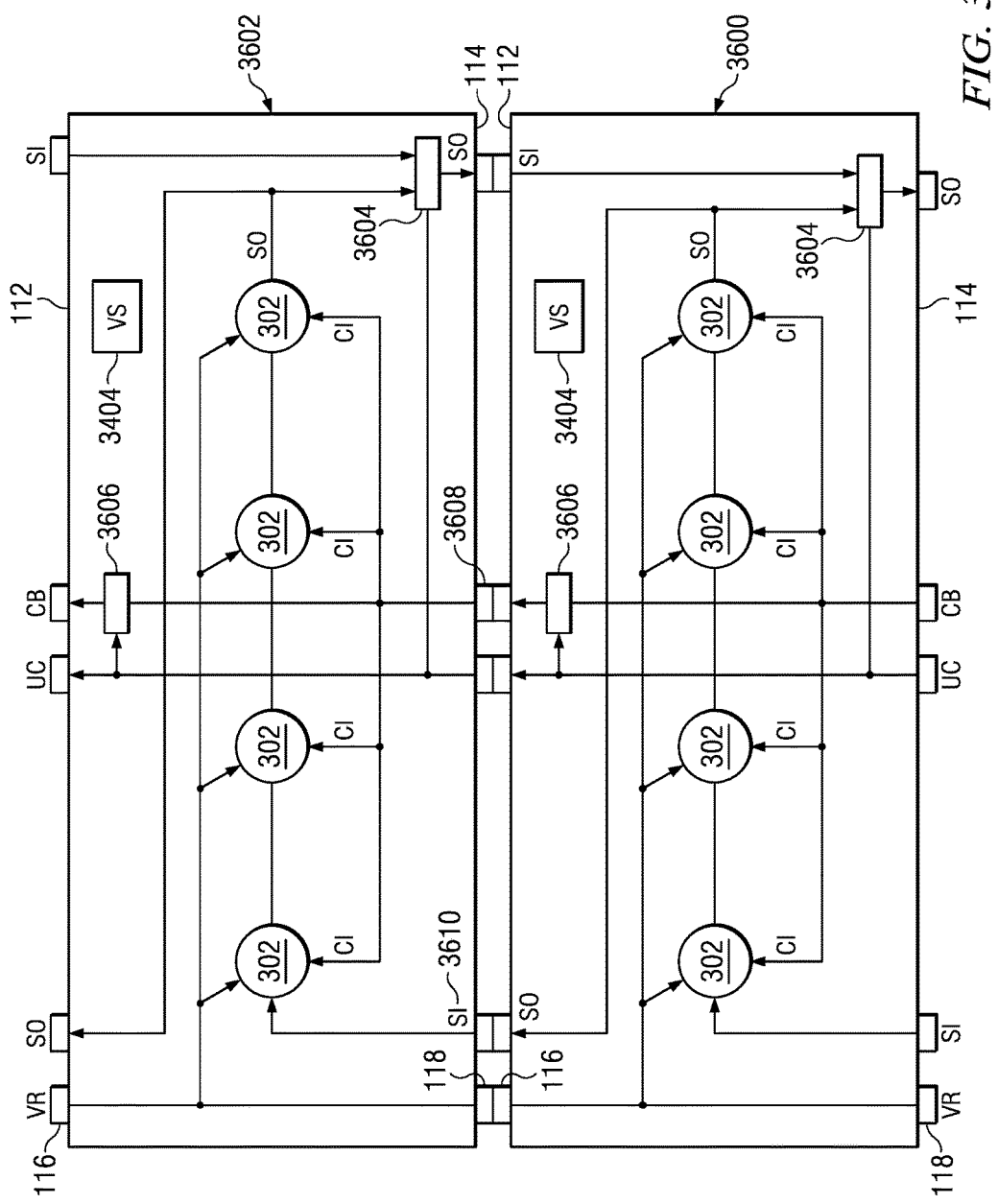
FIG. 36 illustrates a stack of die, each die including TSV scan cells, a voltage select circuit and a control bus (CB) gating circuit, according to the disclosure.

FIG. 36 illustrates a simplified view of a die 3602 with TSV scan cells 302 stacked on top of a die 3600 with TSV scan cells 302 via contact points 116 and 118, according to the disclosure. Die 3600 and 3602 have the VR, SI, CB and SO terminals on the bottom surface 114 and the VS circuit 3404 as described in FIGS. 34 and 35. While not shown, the VS circuit 3404 in die 3600 and 3602 has the V output to scan cells 302 and the SEL input from the CB as shown in FIG. 34. In addition, die 3600 and die 3602 have up control (UDC) signal terminals on the bottom surface 114 and top surface 112. The UDC signal terminals control an SO multiplexer 3604 and a CB gating circuit 3606 in each die 3600 and 3602

When only the scan cells 302 of die 3600 are accessed, the UC signals to die 3600 are set to gate off certain ones or all of the CB signals to the CB terminals 3608 on the bottom surface of die 3602 via gating circuit 3606. Also the UC signals control multiplexer 3604 of die 3600 to pass the SO of the last scan cell in die 3600 to the SO terminal on the bottom surface of die 3600. During scan operations, data is shifted from the SI terminal on the bottom surface of die 3600, through the scan cells 302 of die 3600 and to the SO terminal on the bottom surface of die 3600.

When the scan cells 302 of die 3600 and 3602 are accessed together, the UC signals to die 3600 are set to gate on the CB signals to the CB terminals 3608 on the bottom surface of die 3602 via gating circuit 3606. As seen, the SO of the last scan cell of die 3600 is connected to the SI 3610 of the first scan cell of die 3602. The UC signals also control multiplexer 3604 of die 3602 to output the SO of the last scan cell of die 3602 to multiplexer 3604 of die 3600, and control multiplexer 3604 of die 3600 to output the SO from die 3602 to the SO terminal on the bottom surface of die 3600. During scan operations, data is shifted from the SI terminal on the bottom surface of die 3600, through the scan cells 302 of die 3600 and 3602 and to the SO terminal on the bottom surface of die 3600.

If another die, having the same TSV scan cell architecture as die 3600 and 3602, were stacked on top of die 3602, the scan cells of the other die could be concatenated with the scan cells of die 3602 and 3600, by using the UC signals to appropriately control multiplexers 3604 and gating circuits 3606 of each die in the stack.

Figure 37:
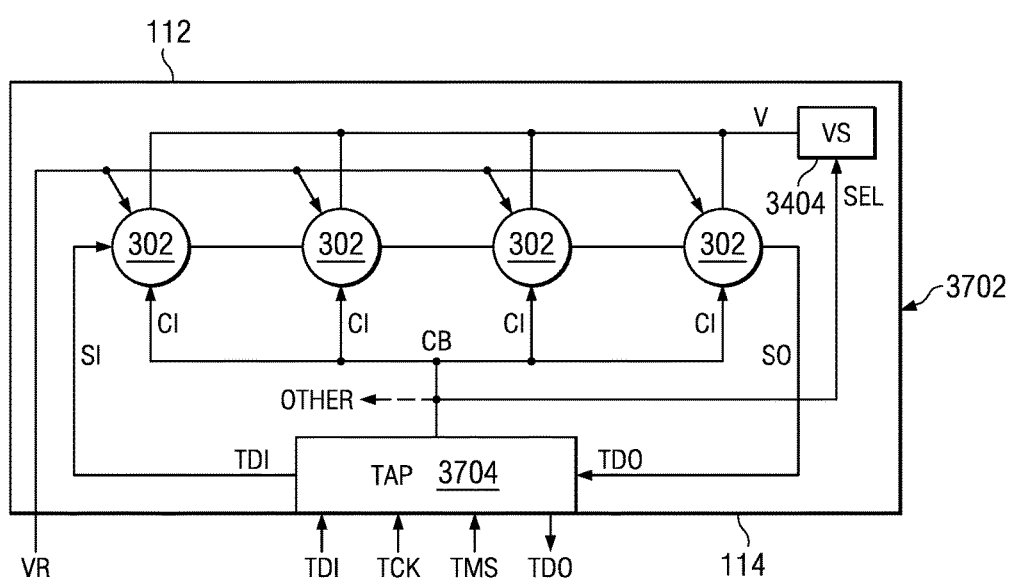
FIG. 37 illustrates a die with TSV scan cells, a voltage select circuit and a test access port (TAP), according to the disclosure.

FIG. 37 illustrates a simplified view of a die 3702 where the SI and SO terminals of the TSV scan cells 302 in the die are serially connected to a TDI and TDO terminal of an IEEE 1149.1 test access port (TAP) 3704 in die 3702. The TAP is connected to TDI, TCK, TMS and TDO signal terminals on the bottom surface 114 of die 3702. The TAP provides the CB signals to control the CI inputs to the scan cells 302, the other control signals and the SEL input to VS circuit 3404 as described in FIG. 34. The advantage of using the TAP is that it reduces the number of test terminals on the bottom surface 114 of die 3702, and thus the number of test connections to a tester. Also, using the TAP allows the TSV testing to be performed using very low cost test controllers. Further the TSV testing can be repeated when die 3702 is assembled into a customer system that has an 1149.1 TAP interface of TDI, TCK, TMS and TDO signals.

Figure 38:
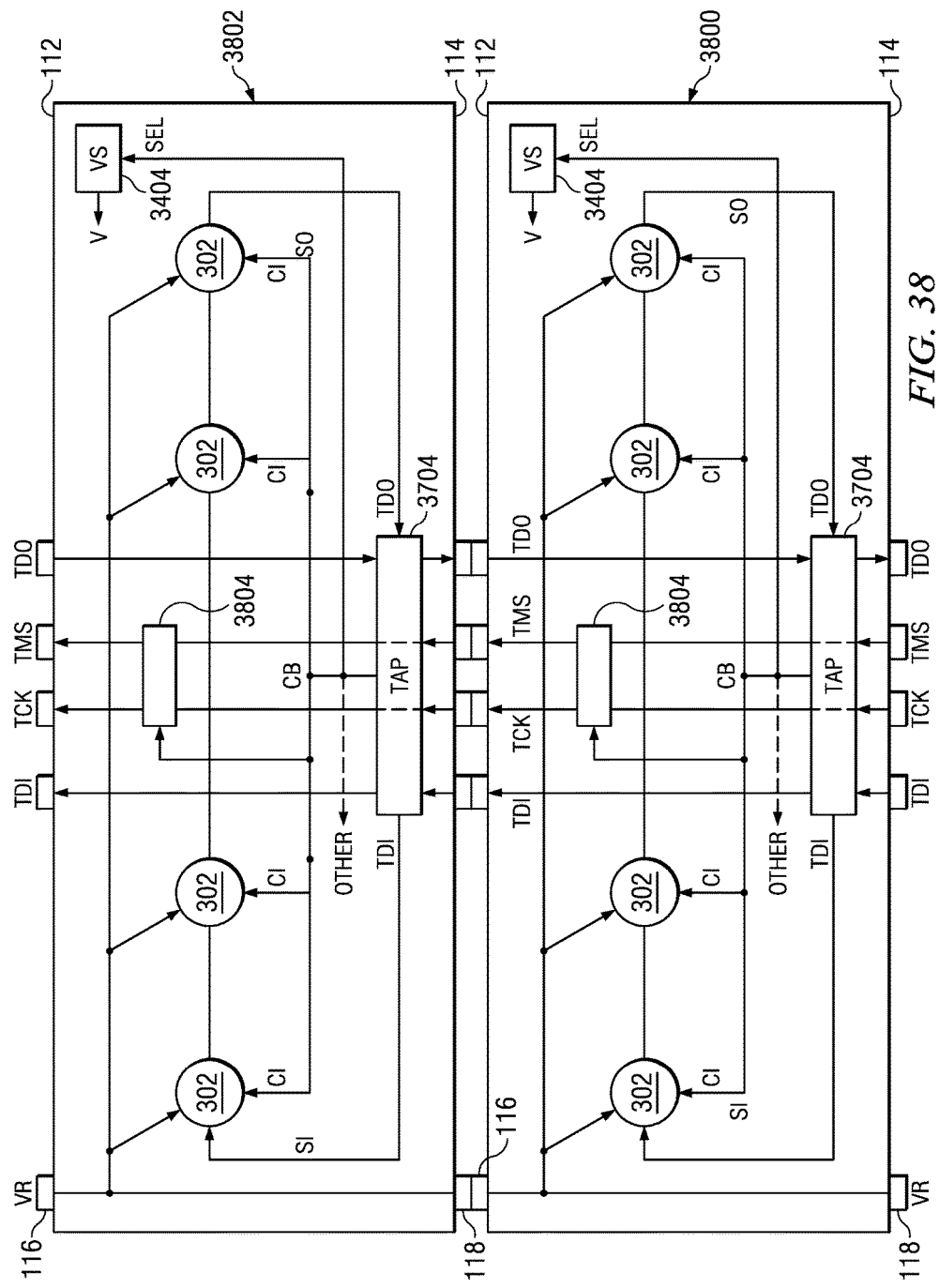
FIG. 38 illustrates a stack of die, each die including TSV scan cells, a voltage select circuit and a TAP, according to the disclosure.

FIG. 38 illustrates a simplified view of a die 3802 with TSV scan cells 302 stacked on top of a die 3800 with TSV scan cells 302 via contact points 116 and 118, according to the disclosure. Die 3800 and 3802 have the VR, TDI, TCK, TMS and TDO terminals on the bottom surface 114, the VS circuit 3404 and the TAP 3704 as described in FIG. 37. In addition, die 3800 and die 3802 have gating circuits 3804 that are used to gate on and off one or both of the TCK and TMS signals to the top surfaces of die 3800 and 3802. The gating circuits receive gating control from the CB output of TAP 3704.

When only the scan cells 302 of die 3800 are accessed, the TAP outputs control on the CB outputs to operate CI inputs to the scan cells, control to operate the VS circuit 3404, control to the other signals and control to gating circuit 3804 to gate off one or both of the TCK and TMS signals to the bottom surface of die 3802. During scan operations, data is shifted from the TAP TDI terminal on the bottom surface of die 3800, through the scan cells 302 of die 3800 and to the TAP TDO terminal on the bottom surface of die 3800.

When the scan cells 302 of die 3800 and 3802 are accessed together, the gating circuit 3804 of die 3800 is enabled by control from the CB bus to pass the TCK and TMS signals from the TAP of die 3800 to the TAP of die 3802. The TCK and TMS signals simply pass through the TAP 3704 from the bottom surface TCK and TMS terminals to the gating circuit 3804, as indicated in dotted line. As seen, TAP 3704 of die 3800 provides a TDI input to TAP 3804 of die 3802 and receives a TDO output from TAP 3704 of die 3802. During scan operations, data is shifted from the TDI terminal on the bottom surface of die 3800, through the scan cells 302 of die 3800, through the TAP of die 3800 to the TDI terminal on the bottom surface of die 3802, through the scan cells 302 of die 3802, through the TAP of die 3802 to the TDO output on the bottom surface of die 3802 and through the TAP of die 3800 to the TDO terminal on the bottom surface of die 3800.

If another die, having the same TSV scan cell architecture as die 3800 and 3802, were stacked on top of die 3802, the scan cells of the other die could be concatenated with the scan cells of die 3800 and 3802 by appropriately controlling the TAPs 3704 and gating circuits 3804 of the die in the stack.

Although the disclosure has been described in detail, it should be understood that various changes, substitutions and alterations may be made without departing from the spirit and scope of the disclosure as defined by the appended claims.

What is claimed is:

1. An integrated circuit comprising:
   (a) a die having a top surface and a bottom surface;
   (b) a top contact point on the top surface and a bottom contact point on the bottom surface;
   (c) a through silicon via in the die having a top end coupled to the top contact point and a bottom end coupled to the bottom contact point;
   (d) a three state buffer having an input coupled to one of the top contact point and the bottom contact point, an output coupled to one end of the through silicon via, and a control input; and
   (e) a scan cell having a reference voltage input, a serial data input, a control input, a stimulus output coupled to the output of the three state buffer and the one end of the through silicon via, a response input coupled to the other end of the through silicon via, and a serial data output.

2. The integrated circuit of claim 1 in which the top end of the though silicon via is coupled to the top contact point and the response input, the three state buffer input is coupled to the bottom contact point, and the three state buffer output is coupled to the bottom end of the through silicon via.

3. The integrated circuit of claim 1 in which the bottom end of the though silicon via is coupled to the bottom contact point and the response input, the three state buffer input is coupled to the top contact point, and the three state buffer output is coupled to the top end of the through silicon via.

4. The integrated circuit of claim 1 including a switch and a load resistor coupled in series between the response input and ground, and the switch includes a load input.

5. The integrated circuit of claim 1 in which the scan cell includes a multiplexer and a flip-flop connected in series between the serial data input and the serial data output.

6. The integrated circuit of claim 1 in which the scan cell includes a multiplexer and a flip-flop connected in series between the serial data input and the serial data output and includes a comparator having one input coupled to the reference voltage input, another input coupled to the response input, and an output coupled to an input of the multiplexer.

* * * * *